US008071436B2

(12) United States Patent
You et al.

(10) Patent No.: US 8,071,436 B2
(45) Date of Patent: Dec. 6, 2011

(54) METHOD OF FABRICATING A SEMICONDUCTOR DEVICE HAVING A LATERAL DOUBLE DIFFUSED MOSFET TRANSISTOR WITH A LIGHTLY DOPED SOURCE AND CMOS TRANSISTOR

(75) Inventors: Budong You, Fremont, CA (US); Marco A. Zuniga, Palo Alto, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 0 days.

(21) Appl. No.: 12/714,914

(22) Filed: Mar. 1, 2010

(65) Prior Publication Data
US 2010/0173458 A1 Jul. 8, 2010

Related U.S. Application Data

(63) Continuation of application No. 11/681,690, filed on Mar. 2, 2007, now Pat. No. 7,671,411.

(60) Provisional application No. 60/778,732, filed on Mar. 2, 2006.

(51) Int. Cl.
H01L 21/8238 (2006.01)

(52) U.S. Cl. ........ 438/204; 438/224; 438/227; 438/228; 438/E21.633

(58) Field of Classification Search .......... 438/204–206, 438/224–227, 275, 527
See application file for complete search history.

(56) References Cited

U.S. PATENT DOCUMENTS

| 5,304,827 | A  | 4/1994  | Malhi et al. |
| 5,349,225 | A  | 9/1994  | Redwine et al. |
| 6,137,140 | A  | 10/2000 | Efland et al. |
| 6,252,278 | B1 | 6/2001  | Hsing |
| 6,424,005 | B1 | 7/2002  | Tsai et al. |
| 6,605,844 | B2 | 8/2003  | Nakamura et al. |
| 6,762,456 | B1 | 7/2004  | D'Anna et al. |
| 6,876,035 | B2 | 4/2005  | Abadeer et al. |
| 6,927,453 | B2 | 8/2005  | Shibib et al. |

(Continued)

FOREIGN PATENT DOCUMENTS

EP    1 321 985 A1    6/2003

OTHER PUBLICATIONS

Office Action in Chinese Application No. 2007100800492 dated Sep. 4, 2009, 4 pages.
Request for Ex Parte Reexamination and Order Granting Request for Ex Parte Reexamination, Control No. 90/011,100 (re-examination of US Patent No. 7,671,411), 102 pages.

(Continued)

Primary Examiner — Dung A. Le
(74) Attorney, Agent, or Firm — Fish & Richardson P.C.

(57) ABSTRACT

Methods and systems for monolithically fabricating a lateral double-diffused MOSFET (LDMOS) transistor having a source, drain, and a gate on a substrate, with a process flow that is compatible with a CMOS process flow are described. In some implementations, a method of fabricating a semiconductor device is provided that includes forming an LDMOS transistor having a first drain with a first drain-side n+ region, a first source with a first source-side n+ region and a first source-side p+ region, and a first gate between the first drain and the first source on the substrate. The method also includes forming an n-type CMOS transistor having a second drain having a second drain-side n+ region, a second source having a second source-side n+ region, and a second gate between the second drain and the second source. In so doing, the LDMOS transistor can be fabricated through a process that can be seamlessly integrated into a sub-micron CMOS process.

10 Claims, 27 Drawing Sheets

U.S. PATENT DOCUMENTS

| | | |
|---|---|---|
| 7,005,703 B2 | 2/2006 | Shibib et al. |
| 7,038,274 B2 | 5/2006 | You et al. |
| 7,074,659 B2 | 7/2006 | Zuniga et al. |
| 7,163,856 B2 | 1/2007 | You et al. |
| 7,220,633 B2 | 5/2007 | You et al. |
| 7,671,411 B2 | 3/2010 | You et al. |
| 2001/0009790 A1 | 7/2001 | Hsing |
| 2002/0011626 A1 | 1/2002 | Croce et al. |
| 2002/0017697 A1 | 2/2002 | Kitamura et al. |
| 2003/0038316 A1 | 2/2003 | Tsuchiko et al. |
| 2003/0128015 A1 | 7/2003 | Zuniga et al. |
| 2003/0141559 A1 | 7/2003 | Moscatelli et al. |
| 2005/0006701 A1 | 1/2005 | Sung et al. |
| 2005/0017297 A1 | 1/2005 | Shimizu et al. |
| 2005/0106825 A1 | 5/2005 | You et al. |
| 2005/0205897 A1 | 9/2005 | Depetro et al. |
| 2005/0227448 A1 | 10/2005 | Chen et al. |
| 2006/0157781 A1 | 7/2006 | Takimoto et al. |
| 2006/0205168 A1 | 9/2006 | Zuniga et al. |
| 2007/0111457 A1 | 5/2007 | You et al. |
| 2007/0166896 A1 | 7/2007 | You et al. |
| 2007/0207600 A1 | 9/2007 | You et al. |

OTHER PUBLICATIONS

Wolf, Stanley Ph.D. "Silicon Processing for the VLSI Era", Silicon Processing for the VLSI Era, vol. 3: The Submicron MOSFET, 5 pages.

Authorized Officer Keun Yong Park, International Search Report for Application No. PCTUS2008/088439, dated Aug. 12, 2009, 11 pages.

Quirk, "Semiconductor manufacturing technology", 100, Prentice-Hall., p. 75, Table 4.2.

European Examiner Andrea Melodia, Supplemental European Search Report for Application No. EP 08868218.2, dated Jun. 24, 2011, 4 pages.

Chinese Examiner Peng Lijuan, The First Office Action for Application No. CN 2008801233266, dated Jun. 8, 2011, 4 pages.

Nehrer, W. et al., "The Optimization of LBC6 Power/Mixed-Signal IC BICMOS Process," IEEE Bipolar/ICMOS Circuits and Technology Meeting, Sep. 30, 2001, pp. 192-195.

Versari, Roberto et al., "Experimental Study of Hot-Carrier Effects in LDMOS Transistors," IEEE Transactions on Electron Devices, Vol. 46, N. 6, Jun. 1999, pp. 1228-1233.

P-Body implanted after gate formation disrupts CMOS thermal budget

P-Body implanted after gate formation disrupts CMOS thermal budget

P-Body implanted after gate formation disrupts CMOS thermal budget

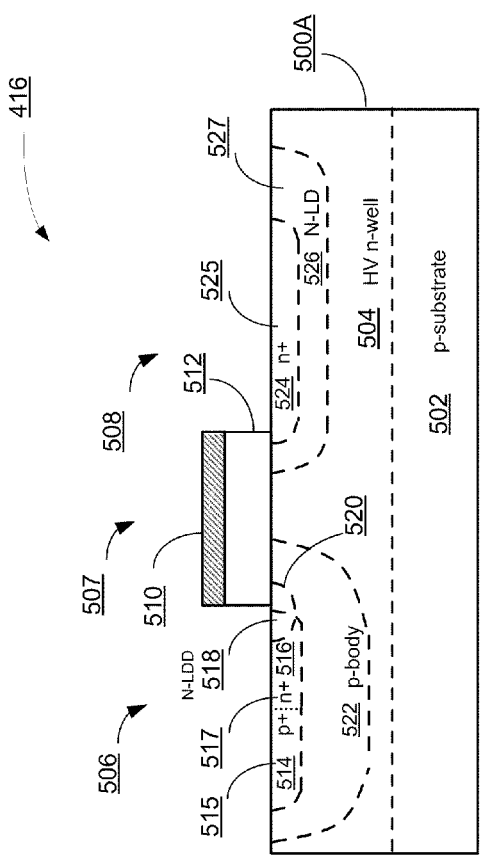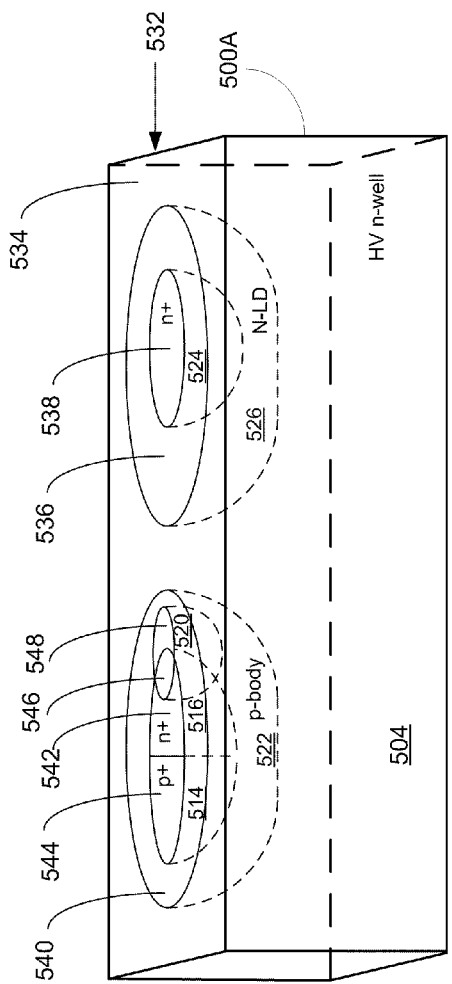
FIG. 5A
FIG. 5B

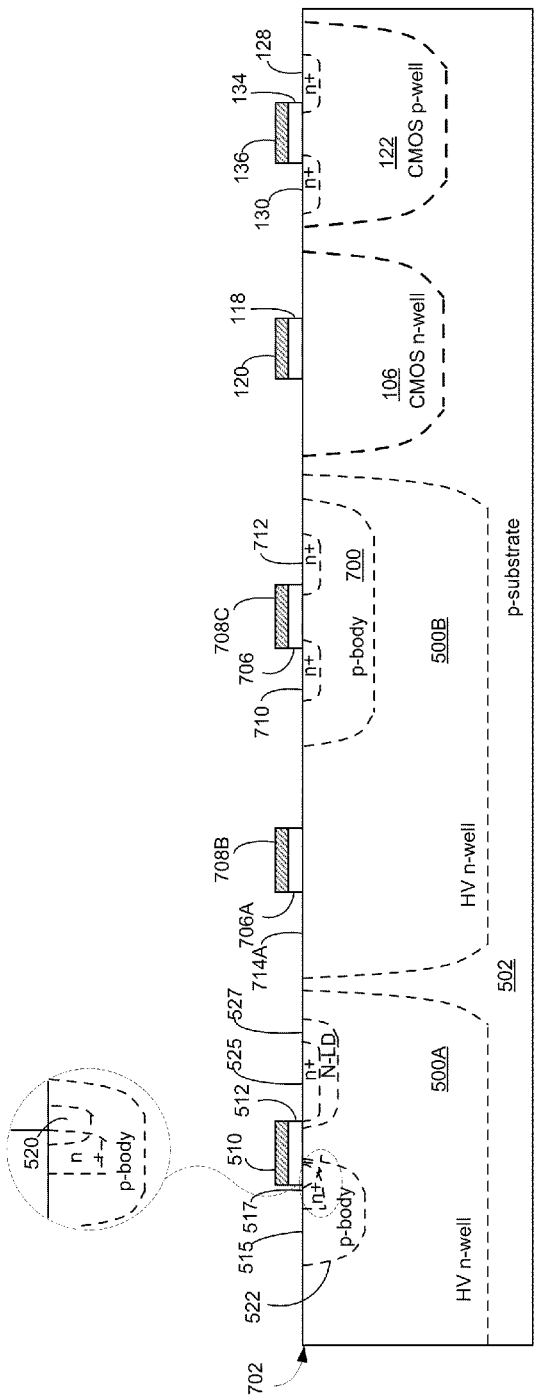
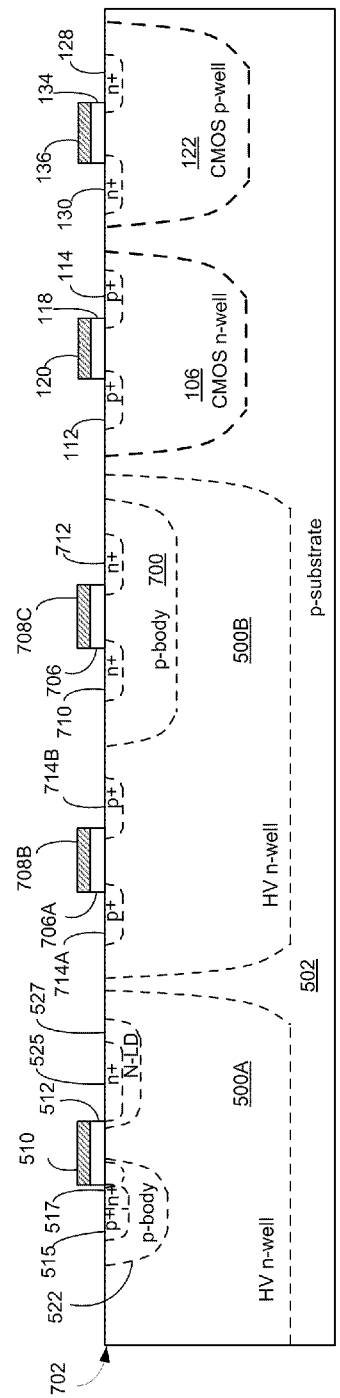
FIG. 7H
FIG. 7I

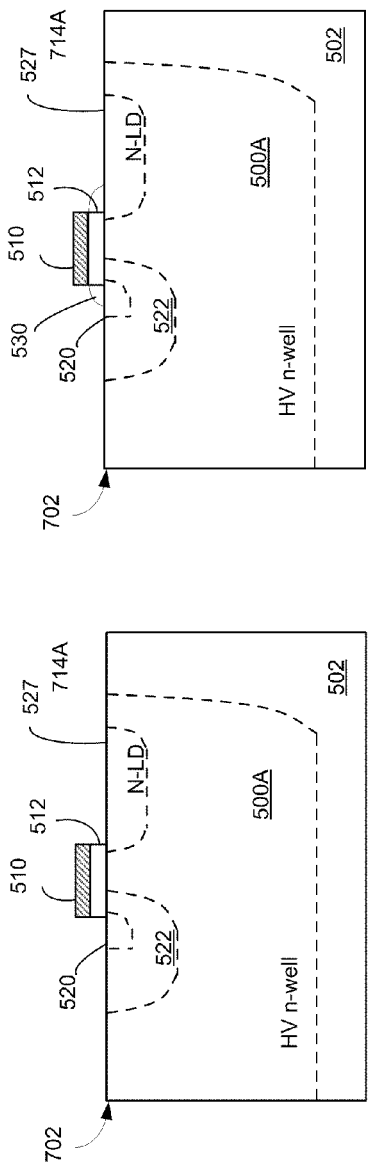
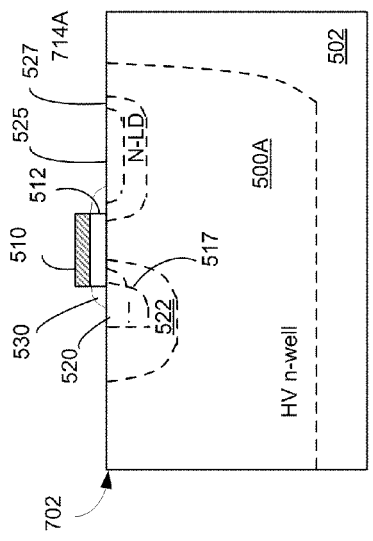
FIG. 7J
FIG. 7K
FIG. 7L

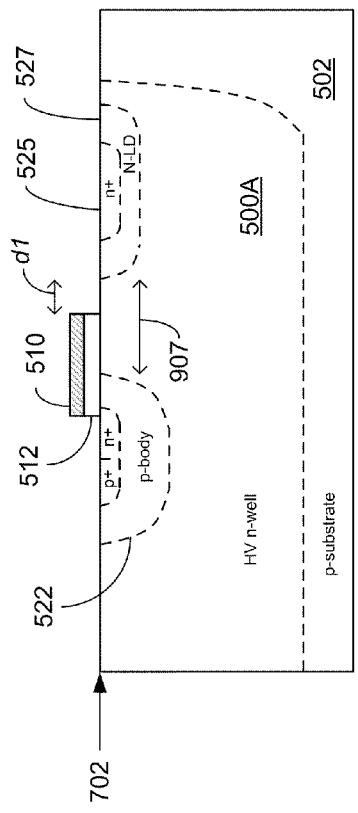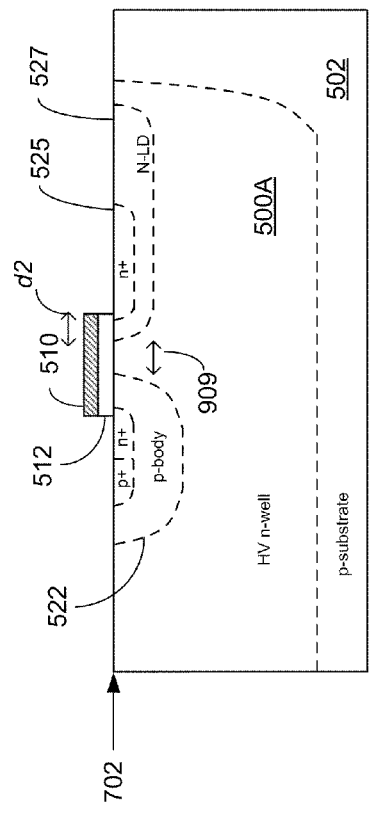
FIG. 9A
FIG. 9B

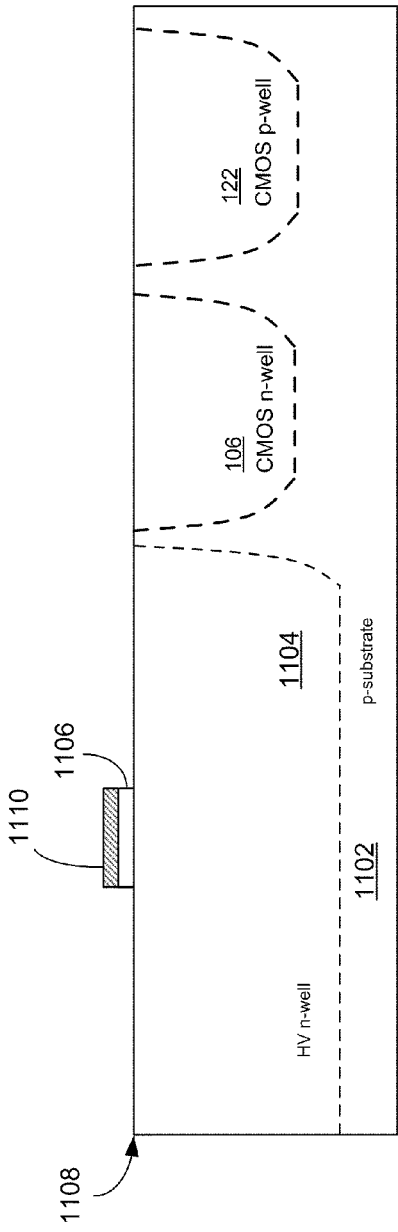
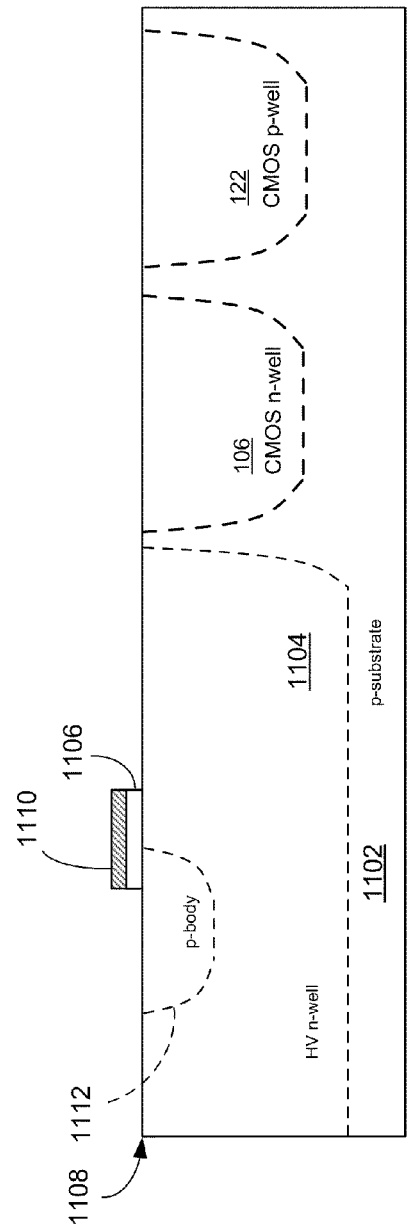

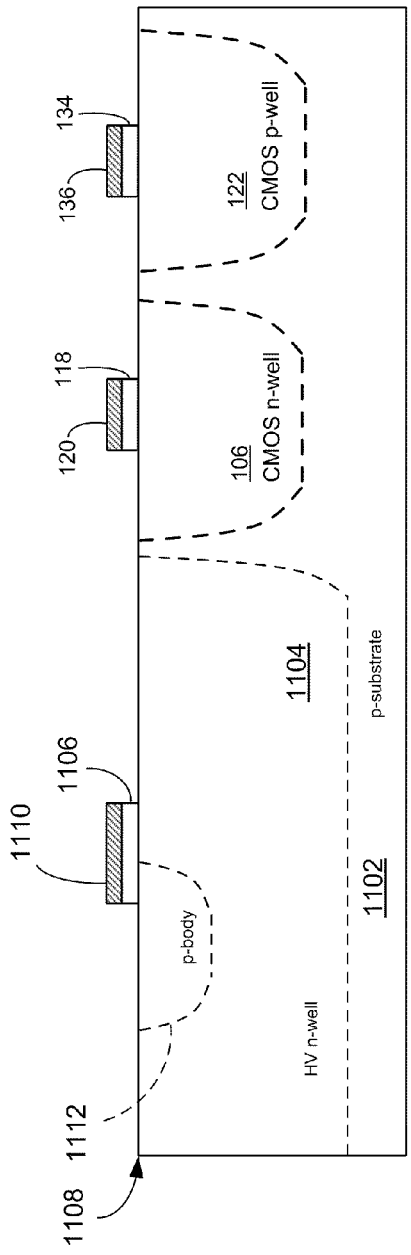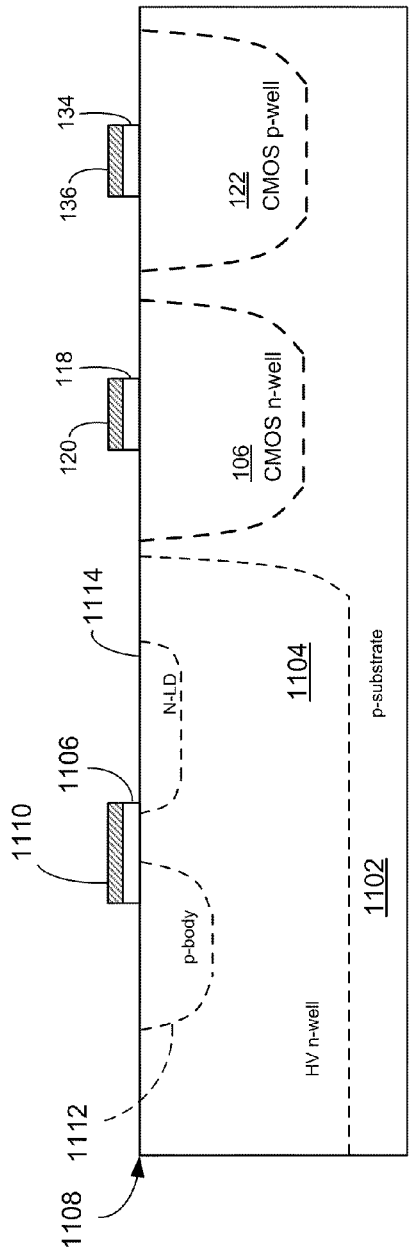
FIG. 11F
FIG. 11G

METHOD OF FABRICATING A SEMICONDUCTOR DEVICE HAVING A LATERAL DOUBLE DIFFUSED MOSFET TRANSISTOR WITH A LIGHTLY DOPED SOURCE AND CMOS TRANSISTOR

CROSS-REFERENCE TO RELATED APPLICATIONS

This application is a continuation of U.S. application Ser. No. 11/681,690, filed Mar. 2, 2007, now U.S. Pat. No. 7,671,411 which claims the benefit of U.S. Provisional Application Ser. No. 60/778,732, filed on Mar. 2, 2006. The disclosure of the prior applications are considered part of and are herein incorporated by reference in their entireties in the disclosure of this application.

TECHNICAL FIELD

The present invention relates to semiconductor devices.

BACKGROUND

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS transistors are commonly used in switching regulators as a result of their performance in terms of a tradeoff between their specific on-resistance ($R_{dson}$) and drain-to-source breakdown voltage ($BV_{d\_s}$). Conventional LDMOS transistors are typically fabricated having optimized device performance characteristics through a complex process, such as a Bipolar-CMOS (BiCMOS) process or a Bipolar-CMOS-DMOS (BCD) process, that includes one or more process steps that are not compatible with sub-micron CMOS processes typically used by foundries specializing in production of large volumes of digital CMOS devices (e.g, 0.5 μm DRAM production technologies), as described in greater detail below. As a result, conventional LDMOS transistors are, therefore, not typically fabricated at such foundries.

A typical sub-micron CMOS process used by foundries specializing in production of large volumes of digital CMOS devices, referred to herein as sub-micron CMOS process, will now be described. A sub-micron CMOS process is generally used to fabricate sub-micron CMOS transistors—i.e., PMOS transistors and/or NMOS transistors having a channel length that is less than 1 μm. FIG. 1 shows a PMOS transistor 100 and an NMOS transistor 102 fabricated through a sub-micron CMOS process on a p-type substrate 104. The PMOS transistor 100 is implemented in a CMOS n-well 106. The PMOS transistor 100 includes a source region 108 and a drain region 110 having p-doped p+ regions 112 and 114, respectively. The PMOS transistor 100 further includes a gate 116 formed of a gate oxide 118 and a polysilicon layer 120. The NMOS transistor 102 is implemented in a CMOS p-well 122. The NMOS transistor 102 includes a source region 124 and a drain region 126 having n-doped n+ regions 128 and 130, respectively. The NMOS transistor 102 further includes a gate 132 formed of a gate oxide 134 and a polysilicon layer 136.

FIG. 2 illustrates a sub-micron CMOS process 200 that can be used to fabricate large volumes of sub-micron CMOS transistors (such as the CMOS transistors shown in FIG. 1). The process 200 begins with forming a substrate (step 202). The substrate can be a p-type substrate or an n-type substrate. Referring to FIG. 1, the CMOS transistors are fabricated on a p-type substrate 104. A CMOS n-well 106 for the PMOS transistor and a CMOS p-well 122 for the NMOS transistor are implanted into the substrate (step 204). The gate oxide 118, 134 of each CMOS transistor is formed, and a CMOS channel adjustment implant to control threshold voltages of each CMOS transistor is performed (step 206). A polysilicon layer 120, 136 is deposited over the gate oxide 118, 134, respectively (step 208). The p+ regions of the PMOS transistor and the n+ regions of the NMOS transistor are implanted (step 210). The p+ regions 112, 114 and n+ regions 128, 130 are highly doped, and provide low-resistivity ohmic contacts. In a sub-micron CMOS process, formation of an n+ region typically occurs through a three-step process in a single masking and photolithography step as follows: 1) a lightly doped n-type impurity region is implanted, 2) an oxide spacer is formed, and 3) a heavily doped n+ impurity region is implanted. Formation of a p+ region occurs in a similar manner. The formation such n+ and p+ regions allow transistors to have an improved hot carrier performance.

Foundries specializing in production of large volumes of digital CMOS devices generally have fixed parameters associated with the foundries' sub-micron CMOS process. These fixed parameters are typically optimized for the mass production of digital sub-micron CMOS transistors. For example, in process step 206, the CMOS channel adjustment implant generally has an associated thermal budget that is typically fixed, and has parameters optimized for mass production of sub-micron CMOS transistors.

As discussed above, conventional LDMOS transistors typically achieve optimized device performance through a complex process, such as a BiCMOS process or a BCD process, that includes one or more process steps that are not compatible with a sub-micron CMOS process optimized for the mass production of digital sub-micron CMOS transistors.

FIG. 3A shows a conventional LDMOS transistor 300 fabricated through a BiCMOS process on a p-type substrate 302. The LDMOS transistor 300 includes source region 304 with an n-doped n+ region 306, a p-doped p+ region 308, and a p-doped P-body diffusion (P-body) 310. The LDMOS transistor 300 also includes a drain region 312 with an n-doped n+ region 314 and an n-type well (HV n-well) 316, and a gate 318, including a gate oxide 320 and a polysilicon layer 322.

In the BiCMOS process, the gate oxide 320, and gate oxide of any CMOS transistors fabricated in the BiCMOS process, is formed prior to implantation of the n+ region 306 and the P-body 310. The BiCMOS process, therefore, allows the gate 318 to serve as a mask during implantation of the n+ region 306 and the P-body 310—i.e., the n+ region 306 and the P-body 310 are self aligned with respect to the gate 318. The self aligned lateral double diffusion of the n+ region 306 and the P-body 310 forms the channel of the LDMOS transistor 300.

Such kinds of self aligned double diffusions are not easily integrated into a sub-micron CMOS process because the subsequent drive-in step (or thermal budget) associated with self aligned double diffusions disrupts the fixed thermal budget associated with sub-micron CMOS process steps (e.g., process step 206) and requires a redesign of the thermal budget allocated to the sub-micron CMOS process steps. That is, the self aligned double diffusions generally includes a drive-in step with a long duration and a high temperature that can cause the characteristics of sub-micron CMOS transistors (e.g., threshold voltages) to shift.

The lateral doping profile in region (a) of the LDMOS transistor 300 controls the tradeoff between the on-resistance $R_{dson}$ and the drain-to-source breakdown voltage $BV_{d\_s}$. The vertical doping profile in region (b) determines the drain-to-substrate breakdown voltage $BV_{d\_sub}$ of the LDMOS transistor, and the pinch-off doping profile in region (c) determines the source-to-substrate punch-through breakdown voltage $BV_{s\_sub}$ of the LDMOS transistor. The source-to-substrate punch-through breakdown voltage $BV_{s\_sub}$ is an important parameter for an LDMOS transistor with a floating operation requirement, e.g, an LDMOS transistor implemented as a high-side control switch in a synchronous buck circuit configuration.

FIG. 3B shows a conventional LDMOS transistor 330 fabricated through a BCD process on a p-type substrate 332. The LDMOS transistor 330 includes source region 334 with an n-doped n+ region 336, a p-doped p+ region 338, and a p-doped P-body 340. The LDMOS transistor 330 also includes a drain region 342 with an n-doped n+ region 344 and an n-type layer (HV n-Epi) 346, and a gate 348, including a gate oxide 350 and a polysilicon layer 352. As with the BiCMOS process, in the BCD process, the gate oxide 350, and gate oxide of any CMOS transistors fabricated in the BCD process, is formed prior to implantation of the n+ region 336 and the P-body 340.

In the BCD process, an n+buried layer 354 can be grown on the p-type substrate 332 to improve the source-to-substrate punch-through breakdown characteristics of the LDMOS transistor. Such an approach offers an improved tradeoff between the on-resistance $R_{dson}$ and drain-to-source breakdown voltage $BV_{d\_s}$ of the LDMOS transistor as the lateral doping profile of the LDMOS transistor can be optimized without constrain on the vertical doping profiles. However, such a BCD process includes the growth of the HV n– Epi layer 346, and this step is generally not compatible with a sub-micron CMOS process.

Another approach used in a BCD process is to utilize an n– layer 360 implanted in the drain region 362 of the LDMOS transistor 364 as shown in FIG. 3C. The n– layer 360, n+ region 366, and P-body 368 are self aligned with respect to the gate 370—i.e., the n– layer 360, n+ region 366, and P-body 368 are implanted after formation of gate oxide 372. The inclusion of the n– layer 360 provides an additional parameter to further optimize the tradeoff between the on-resistance $R_{dson}$ and drain-to-source breakdown voltage $BV_{d\_s}$ of the LDMOS transistor. Similar to the n+ buried layer approach of FIG. 3B, the inclusion of the n– layer 360 at the surface provides a method to decouple vertical and horizontal doping constraints.

SUMMARY

In one aspect, the invention is directed to a method of fabricating a transistor having a source, drain, and a gate on a substrate. The method includes implanting, into a surface of the substrate, a high voltage n-doped n-well; forming a gate oxide between a source region and a drain region of the transistor; covering the gate oxide with a conductive material; implanting, into the source region of the transistor, a p-doped p-body; implanting, only into the source region of the transistor, a n-doped lightly doped source; implanting, into the source region of the transistor, a first n-doped n+ region, the first n-doped n+ region overlapping a portion of the n-doped lightly doped source; implanting, into the drain region of the transistor, a second n-doped n+ region; and implanting, into the source region of the transistor, a p-doped p+ region.

Implementations of the invention may include one or more of the following features. The n-doped lightly doped source may extend beneath the gate oxide, or extend further laterally than the first n-doped n+ region beneath the gate oxide. The method may further include forming an oxide spacer on each side of the gate oxide after implanting the n-doped lightly doped source but before the first n-doped n+ region and the second n-doped n+ region. The oxide spacer may be formed prior to formation of the first n-doped n+ region and the second n-doped n+ region. The n-doped lightly doped source may be formed after formation of the gate oxide. The first n-doped n+ region and the second n-doped n+ region may be implanted using the same mask. In the source region, a surface area of the n-doped lightly doped source, a surface area of the first n-doped n+ region and a surface area of the p-doped p+ region may be located within a surface area of the p-doped p-body. The p-doped p-body may be implanted after formation of the gate oxide. The method may further include implanting, into the source region of the transistor, a n-doped lightly doped source including abutting a surface area of the n-doped lightly doped source with a surface area of the p-doped p+ region, and the first gate region may abut the second gate region. The n-doped lightly doped source may be self-aligned to the first gate region and may not extend laterally into the second gate region as measured along the surface of the transistor. The n-doped lightly doped source and the first n-doped n+ region may be implanted separately using separate masks. The drain region may be formed without a lightly doped source, and the second n-doped n+ region may be self-aligned to the gate of the transistor. The method may further include implanting, into the drain region of the transistor, a n-doped shallow drain. In the drain region, a surface area of the second n-doped n+ region may be located entirely within a surface area of the n-doped shallow drain. The n-doped shallow drain may be self aligned to the gate of the transistor and may be implanted after formation of the gate oxide. The n-doped lightly doped source and the first n-doped n+ region may be implanted using the same mask.

In another aspect, the invention is directed to a transistor. The transistor includes a p-type substrate; a high voltage n-well formed in a surface area of the p-type substrate; a source including: a p-doped p-body, a p-doped p+ region within the p-body, a first n-doped n+ region within the p-body and abutting the p+ region, and a n-doped lightly doped source (N-LDS) region overlapping the first n-doped n+ region, a drain including a second n-doped n+ region; and a gate to control a depletion region between the source and the drain.

Implementations of the invention may include one or more of the following features. The drain may further include an n-doped shallow drain, the second n-doped n+ region being within the n-doped shallow drain. The second n+ region may extend deeper than the n-doped shallow drain. The second n-doped n+ region may be self-aligned to the gate of the transistor. The first n+ region may be surrounded by the p-body. The p-body may be deeper than the p+ region, the first n+ region and the N-LDS region. The gate may include a gate oxide between the source and the drain, and wherein the N-LDS may extend beneath the gate oxide. The N-LDS region may extend further laterally beneath the gate oxide than the n+ region. The n-doped shallow drain may extend beneath the gate oxide. An outer boundary of the n-doped shallow drain may extend further laterally beneath the gate oxide toward the source than an outer boundary of the second n-doped n+ region. The p-doped body may be self-aligned to the gate of the transistor. The n-doped shallow drain may be self-aligned to the gate of the transistor. The gate oxide may be covered with a conductive material. An outer boundary of the n-doped lightly doped source may be aligned with an outer boundary of the first n-doped n+ region. The n-doped lightly doped source may be adjacent to and abut the p+ region. The n-doped lightly doped source may be implanted only in the source and not in the drain.

In yet another aspect, the invention is directed to a method of fabricating a transistor having a source, drain, and a gate on a substrate. The method includes implanting, into a surface of the substrate, a first impurity region with a first volume and a first surface area, the first impurity region being of a first conductivity type; forming a gate oxide between a source region and a drain region of the transistor; covering the gate oxide with a conductive material; implanting, only into the source region of the transistor, a second impurity region with a second volume and a second surface area in the first surface area, the second impurity region being of an opposite second conductivity type relative to the first conductivity type; implanting, into the source region of the transistor, a third impurity region with a third volume and a third surface area and a fourth impurity region with a fourth volume and a fourth surface area, in the second surface area, the third impurity region being of the first conductivity type, the fourth impurity region being of an opposite second conductivity type; implanting, into the drain region of the transistor, a fifth impurity region with a fifth volume and a fifth surface area, the fifth impurity region being of the first conductivity type; and implanting, into the source region of the transistor, a sixth impurity region with a sixth volume and a sixth surface area in the second surface area of the second impurity region, the sixth impurity region being of the first conductivity type.

In yet another aspect, the invention is directed to a transistor. The transistor includes a semiconductor body with a first conductivity type; a first impurity region with an opposite second conductivity type formed in a surface area of the semiconductor layer; a source including: a first impurity region of the first conductivity type having a first volume and a first surface area, a second impurity region of the first conductivity type having a second volume and a second surface area, wherein the second volume is embedded in the first volume, and the second surface area is surrounded by the first surface area, a third impurity region of the opposite second conductivity type having a third volume and a third surface area, wherein the third volume abuts the second volume, and wherein the third surface area is adjacent to the second surface area, and a fourth impurity region of the opposite second conductivity type having a fourth volume and a fourth surface area, wherein the fourth volume overlaps a portion of the third volume and a portion of the first volume, and wherein the fourth surface area overlaps a portion of the third surface area, and is at least partially surrounded by the first surface area, a drain including a fifth impurity region of the opposite second conductivity type, the fifth impurity region having a fifth volume and a fifth surface area; and a gate to control a depletion region between the source and the drain.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 5A-5B are a schematic cross-sectional view of an LDMOS transistor and a three-dimensional view of the surface area of the LDMOS transistor source and drain regions, respectively.

FIGS. 7A-7M illustrate the exemplary processes of manufacturing an LDMOS transistor, a PMOS transistor, and an NMOS transistor according to the exemplary processes of FIG. 6.

FIGS. 9A-9B illustrate exemplary shallow drain implant processes.

FIGS. 11A-11H illustrate an exemplary process of manufacturing an LDMOS transistor according to the exemplary process of FIG. 10.

Like reference symbols in the various drawings indicate like elements.

DETAILED DESCRIPTION

Figure 1:
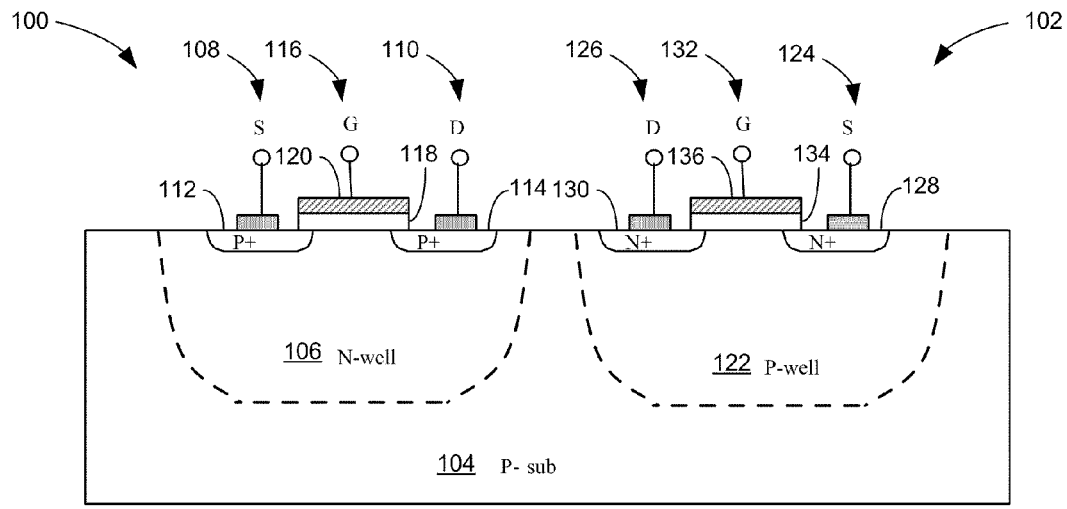
FIG. 1 is a schematic cross-sectional view of a conventional PMOS transistor and NMOS transistor formed on a p-type substrate.
Figure 2:
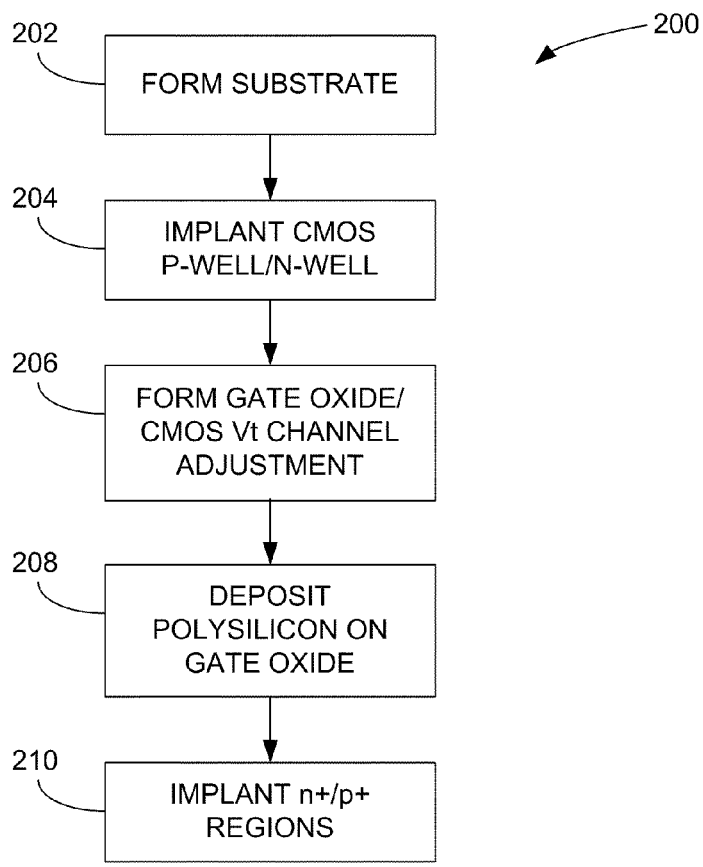
FIG. 2 is a flow diagram illustrating a conventional sub-micron CMOS process for manufacturing CMOS transistors.
Figure 3A:
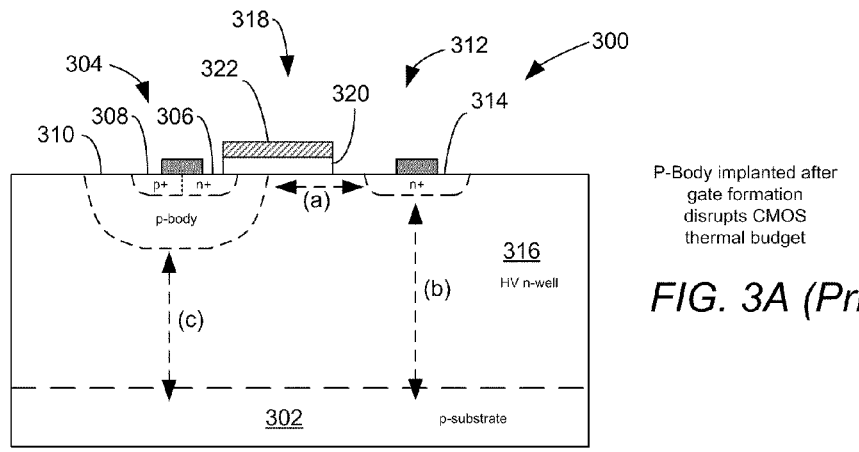
FIGS. 3A, 3B, and 3C are schematic cross-sectional views of conventional LDMOS transistors.
Figure 3B:
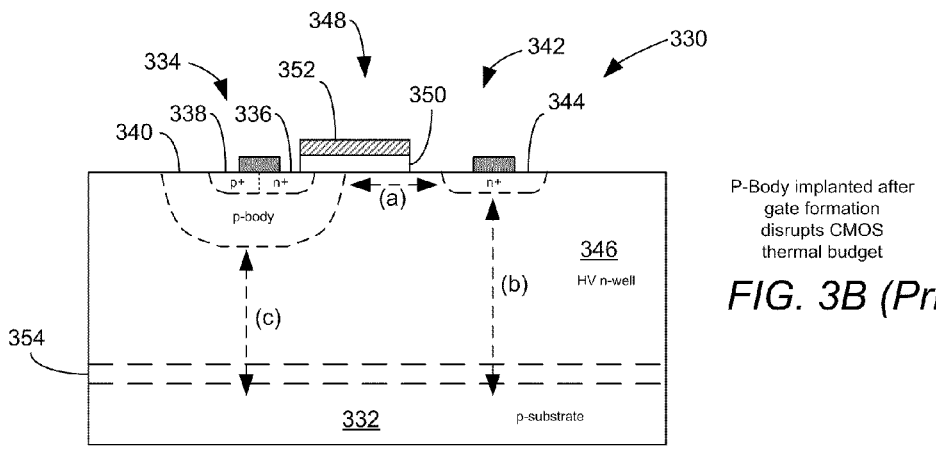
Figure 3C:
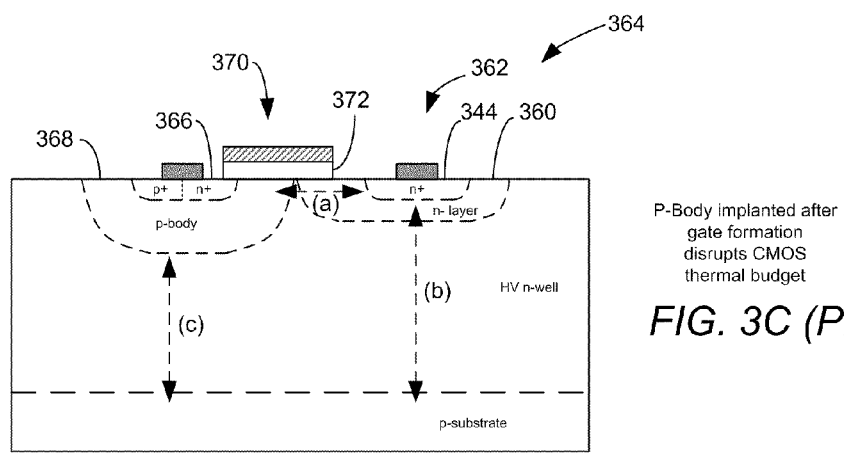
Figure 4:
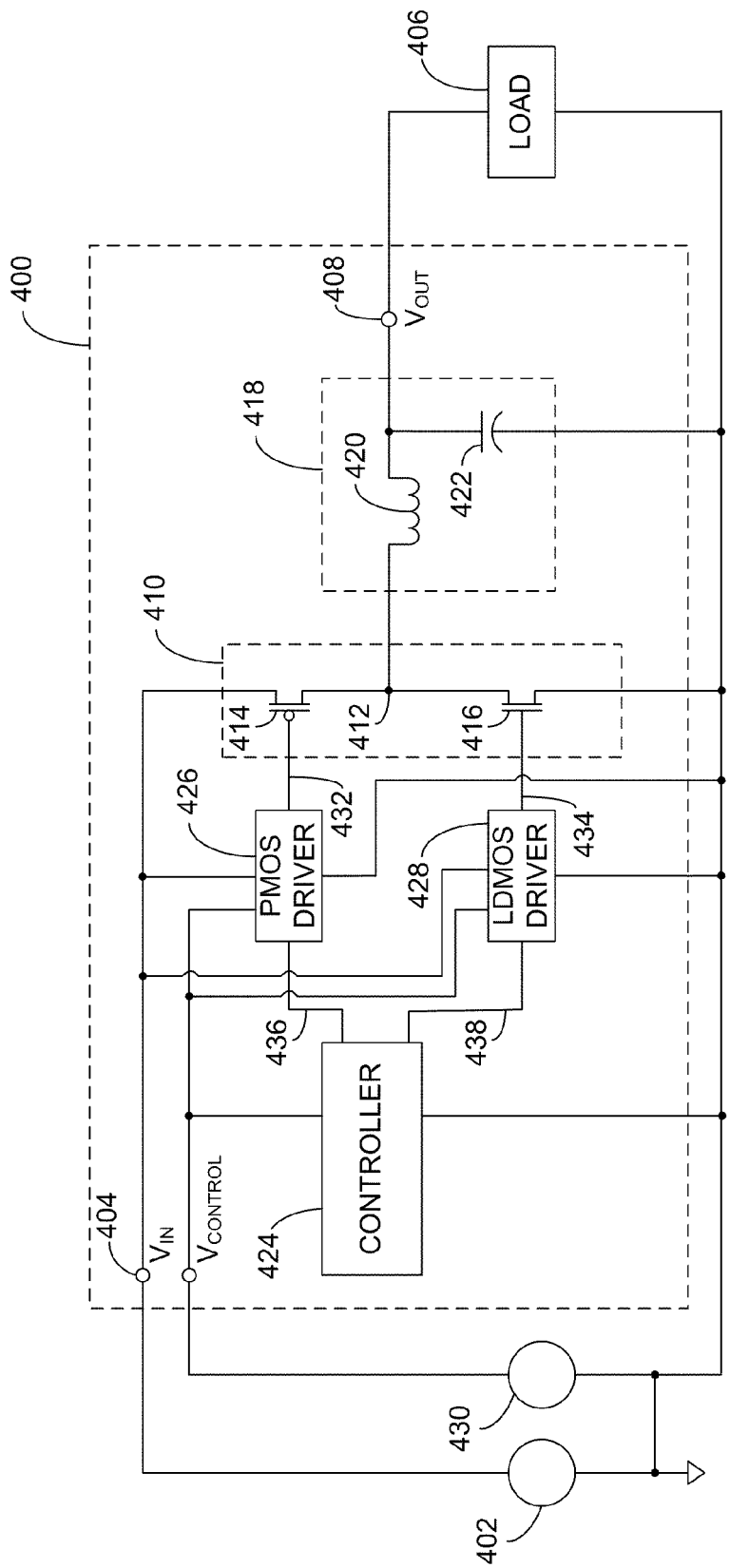
FIG. 4 is an exemplary block diagram of a buck switching regulator.

FIG. 4 is a block diagram of a switching regulator 400 including an LDMOS transistor according to one implementation. Conventional LDMOS transistors typically achieve optimized device performance through a complex process, such as a BiCMOS process or a BCD process, that includes one or more process steps not compatible with a sub-micron CMOS process optimized for the mass production of digital sub-micron CMOS transistors. According to one aspect, an LDMOS transistor is provided that can be fabricated through a process that can be seamlessly integrated into a typical sub-micron CMOS process.

Referring to FIG. 4, an exemplary switching regulator 400 is coupled to a first high DC input voltage source 402, such as a battery, by an input terminal 404. The switching regulator 400 is also coupled to a load 406, such as an integrated circuit, by an output terminal 408. The switching regulator 400 serves as a DC-to-DC converter between the input terminal 404 and the output terminal 408. The switching regulator 400 includes a switching circuit 410 which serves as a power switch for alternately coupling and decoupling the input terminal 404 to an intermediate terminal 412. The switching circuit 410 includes a rectifier, such as a switch or diode, coupling the intermediate terminal 412 to ground. Specifically, the switching circuit 410 may include a first transistor 414 having a source connected to the input terminal 404 and a drain connected to the intermediate terminal 412 and a second transistor 416 having a source connected to ground and a drain connected to the intermediate terminal 412. The first transistor 414 may be a Positive-Channel Metal Oxide Semiconductor (PMOS) transistor, whereas the second transistor 416 may be an LDMOS transistor.

The intermediate terminal 412 is coupled to the output terminal 408 by an output filter 418. The output filter 418 converts the rectangular waveform of the intermediate voltage at the intermediate terminal 412 into a substantially DC output voltage at the output terminal 408. Specifically, in a buck-converter topology, the output filter 418 includes an inductor 420 connected between the intermediate terminal 412 and the output terminal 408 and a capacitor 422 connected in parallel with the load 406. During a PMOS conduction period, the first transistor is closed, and the voltage source 402 supplies energy to the load 406 and the inductor 420 through the first transistor 414. On the other hand, during an LDMOS transistor conduction period, the second transistor 416 is closed, and current flows through the second transistor 416 as energy is supplied by the inductor 420. The resulting output voltage $V_{out}$ is a substantially DC voltage.

The switching regulator also includes a controller 424, a PMOS driver 426 and an LDMOS driver 428 for controlling the operation of the switching circuit 400. The PMOS driver 426 and the LDMOS driver are coupled to voltage source 430. A first control line 432 connects the PMOS transistor 414 to the PMOS driver 426, and a second control line 434 connects the LDMOS transistor 416 to the LDMOS driver 428. The PMOS and NMOS drivers are connected to the controller 424 by control lines 436 and 438, respectively. The controller 424 causes the switching circuit 400 to alternate between PMOS and LDMOS conduction periods so as to generate an intermediate voltage $V_{int}$ at the intermediate terminal 412 that has a rectangular waveform. The controller 424 can also include a feedback circuit (not shown), which measures the output voltage and the current passing through the output terminal.

Although the controller 424 is typically a pulse width modulator, the invention is also applicable to other modulation schemes, such as pulse frequency modulation.

Although the switching regulator discussed above has a buck converter topology, the invention is also applicable to other voltage regulator topologies, such as a boost converter or a buck-boost converter, and to RF output amplifiers.

FIG. 5A shows a schematic cross-sectional view of the LDMOS transistor 416. The LDMOS transistor 416 can be fabricated on a high voltage n-type well (HV n-well) 500A implanted in a p-type substrate 502. An HV n-well implant is typically a deep implant and is generally more lightly doped relative to a CMOS n-well. The HV n-well 500A can have a retrograded vertical doping profile. The LDMOS transistor 416 generally includes a source region 506, a drain region 508, and a gate 507.

The source region 506 generally includes an p-doped p+ region 515, an n-doped n+ region 517, and a p-doped P-body 522. The drain region 508 generally includes an n-doped n+ region 525 and an n-doped shallow drain (N-LD) 527. In some implementations, the source region 506 further includes an n-type lightly doped region 518 (in some contexts, the lightly doped region can be considered to be part of the n+). The lightly doped region 518 of the LDMOS transistor can be implanted using similar techniques performed with respect to N-LDD regions in conventional CMOS processes, and thus might itself be considered to be an N-LDD region in some contexts. However, this lightly doped region that would be the equivalent of an N-LDD in a conventional CMOS transistor is formed only in the source, but not in the drain. Therefore, the lightly doped region 518 will be referred hereinafter as an N-LDS (n-type lightly doped source).

As shown, the N-LDS region 518 overlaps a portion of the n-doped n+ region 517, and can extend under the gate oxide 512 further than the n+ region 517. In these implementations, the N-LDS can be implanted before the formation of the oxide spacer, thus permitting the N-LDS region 518 to extend further into the channel than the n+ region 517. The N-LDS region 518 can be implanted simultaneously and with the same process as the N-LDD regions in any CMOS transistors on the substrate. Separate masks can be employed for implanting the N-LDS region 518 and the n-doped n+ region 517, thus permitting placing the N-LDS selectively on the source regions. Alternatively, the N-LDS region 518 and the n-doped n+ region 517 can be implanted using a same mask to control, for example, the overlapping region between the N-LDS region 518 and the n-doped n+ region 517. In the later implementation, the n-doped n+ region 525 in the drain would be implanted using a mask different from that used in forming the n-doped n+ region 517 in the source so that no N-LDD is implanted in the drain. Using different masks also can provide flexibility with respect to, for example, the relative dopant concentration of the n doped n+ region 525 and the n-doped n+ region 517.

In some implementations, the N-LDS region 518 can be shallower than the n-doped n+ region 517 (i.e., the n-doped n+ region 517 extends deeper into the substrate 502 than the N-LDS region 518). The boundary of the N-LDS region 518 farther from the gate can be located closer to the gate than the outer boundary of n-doped n+ region 517, or it can be aligned with a boundary of the n-doped n+ region 517 and abut the boundary of the p-doped p+ region 515 (see, e.g., FIG. 7M)

The HV n-well 500A, the N-LD 527, and the n+ region 525 in the drain region 508 are volumes containing doped material. Likewise, the n+ region 517, the p+ region 515, and the P-body 522 in the source region 506 are volumes containing doped material. In some implementations, both the N-LD 527 and the HV n-well 500A can have a lower concentration of impurities than that of the n+ regions 517, 525. Portions at which these volumes overlap may have a higher doping concentration than the individual volumes separately. For example, a portion 524 that contains the overlapping volumes of the n+ region 525, the N-LD 527, and the HV n-well 500A can have the highest doping concentration among other overlapping volume portions. A portion 526 that contains the overlapping volumes of the N-LD 527 and the HV n-well 500A excluding the n+ region 525, can have a lower doping concentration than that of the portion 524. A portion 504 that only includes the HV n-well 500A can have a lower doping concentration than that of the portion 524 or 526, because it does not include multiple overlapping doped volumes.

With respect to the N-LDS region 518, in some implementations, the portion at which the N-LDS region 518 and the n+ region 517 overlap can have a higher doping concentration of impurities than the individual volumes separately. In these implementations, the volume containing the N-LDS region 518 (i.e., N-LDS portion 520) can have a doping concentration lower than that of the n+ region portion 516 and/or the p+ region portion 514, but a doping concentration higher than that of the P-body 522.

Referring to FIG. 5B, volumes of the p+ region 514, n+ regions 516/525, N-LDS region 520, P-body 522 and N-LD region 527 can each have a surface area on the surface 532 of the LDMOS transistor 416. The HV n-well 500A has a surface area 534. For example, in the drain region 508, the portion 526 of the N-LD region has a surface area 536 located within the surface area of the HV n-well 500A. The portion 524 of the n+ region has a surface area 538 located within the surface area 536 of the portion 526 of the N-LD region. In the source region 506, the P-body 522 has a surface area 540 located within the surface area 534. The portion 514 of the p+ region and the portion 516 of the n+ region have a surface area 544 and 542, respectively, each being located within the surface area 540 of the P-body 522.

In implementations where a N-LDS region 518 is diffused into the P-body 522, the portion 520 of the N-LDS region 518 also can have a surface area 548 located within the surface area 534. The portion of the N-LDS region 518 overlapping the portion 516 of the n+ region can have a surface area 546 on the LDMOS transistor 416.

Figure 6:
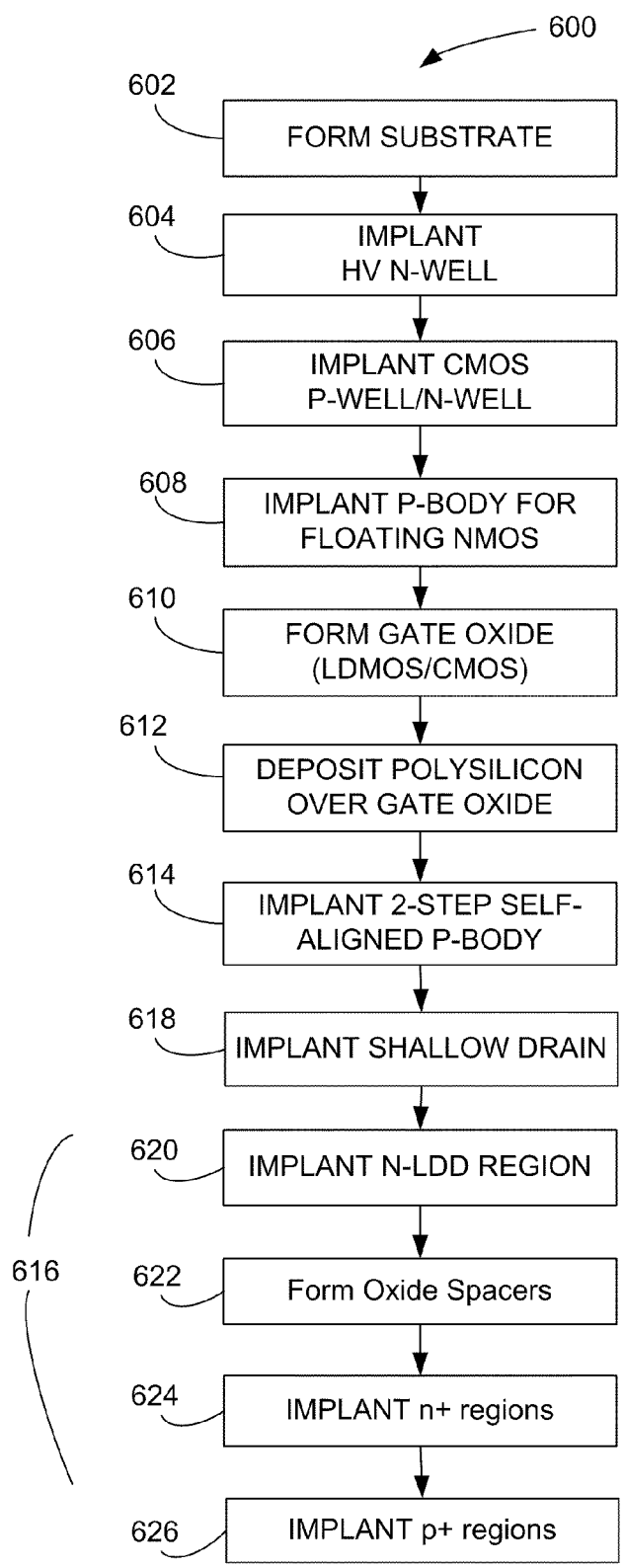
FIG. 6 is a flow diagram illustrating an exemplary process for manufacturing a semiconductor transistor, including an LDMOS transistor, that is compatible with a sub-micron CMOS process.

FIG. 6 illustrates an exemplary process 600 of fabricating a semiconductor device, including an LDMOS transistor, a PMOS transistor with floating operation capability (e.g., the source of the transistor is not grounded), and an NMOS transistor with floating operation capability, that is compatible with a sub-micron CMOS process.

Figure 7A:
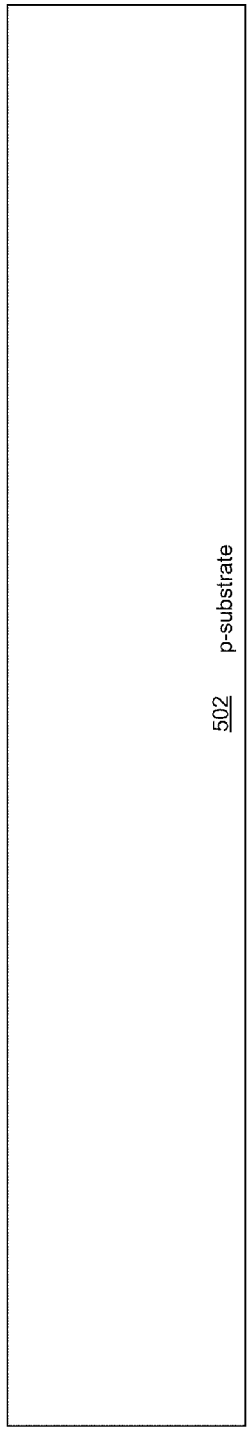
Figure 7B:
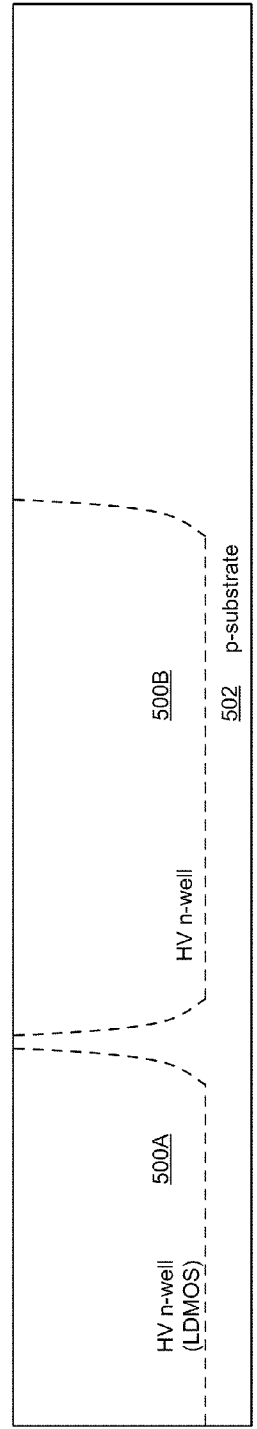

The process 600 begins with forming a substrate (step 602). The substrate can be a p-type substrate or a n-type substrate. Referring to the example of FIG. 7A, a semiconductor layer including a p-type substrate 502 is formed. Next, HV n-wells 500A and 500B for the LDMOS transistor, PMOS transistor with floating operation capability, and NMOS transistor with floating operation capability, as shown in FIG. 7B, are implanted into the p-type substrate 502 (step 604). In some implementations, the HV n-wells 500A and 500B can be integrated as a single well. Alternatively, the HV n-well 500A and the HV n-well 500B can be implanted as separate wells. The HV n-well 500A and the HV n-well 500B also can be implanted simultaneously or sequentially depending on a design application.

Figure 7C:
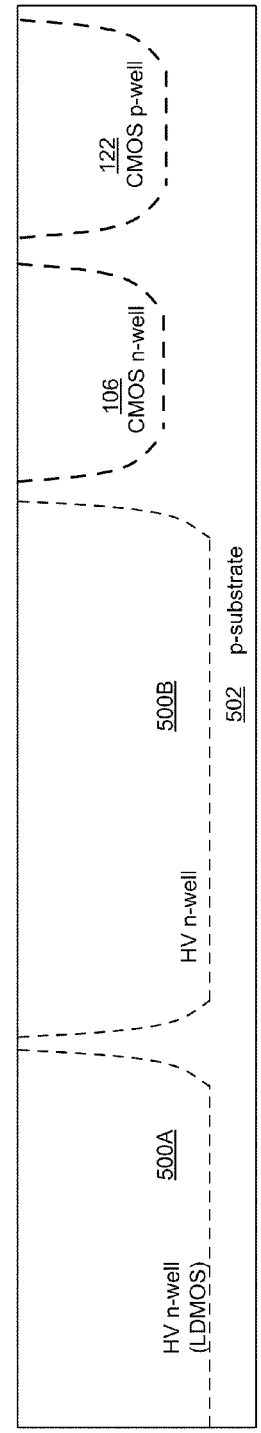

A CMOS n-well 106, for example, for a PMOS transistor, and a CMOS p-well 122, for example, for a NMOS transistor, are implanted into the p-type substrate 502, as illustrated in FIG. 7C (step 606). While it is illustrated that the CMOS n-well 106 and the CMOS p-well 122 are formed after the HV n-wells 500A and 500B, the order can be reversed so that the CMOS n-well 106 and the CMOS p-well 122 are formed prior to implanting the HV n-wells 500A and 500B. In some implementations, the HV n-wells 500A and 500B, and the CMOS n-well 106 can be implanted simultaneously, for example, by using a single mask. In other implementations, each of the HV n-wells 500A and 500B, and the CMOS n-well 106 can be implanted sequentially (and in any order).

Figure 7D:
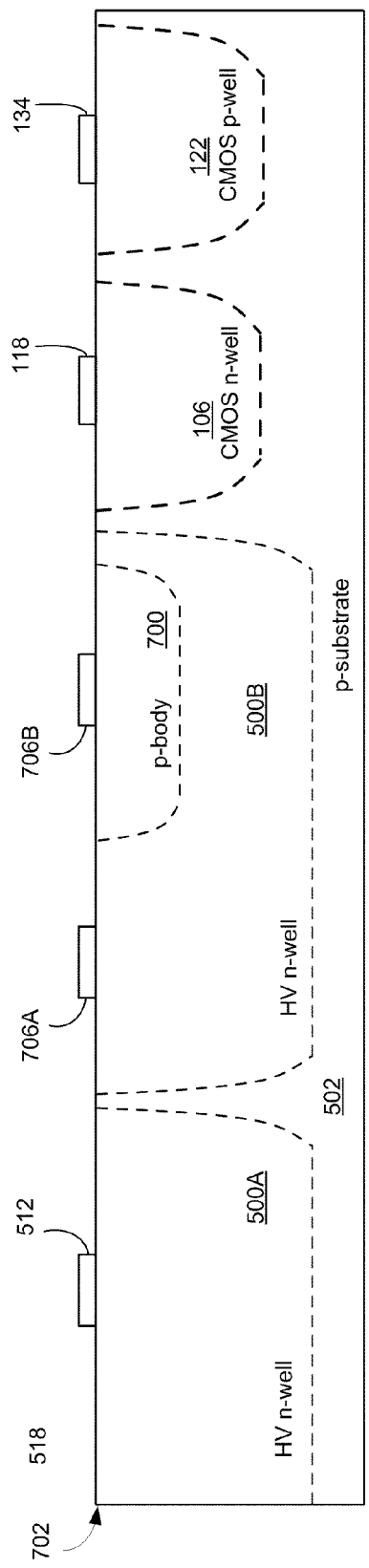

Referring to FIG. 7D, a P-body for the NMOS transistor with floating operation capability can be implanted (step 608). For example, a P-body 700 for the NMOS transistor with floating operation capability can be implanted into the HV n-well 500B.

After implantation of the P-body 700 for the floating NMOS transistor, the gate oxide for each of the LDMOS transistor, the PMOS transistor with floating operation capability, the NMOS transistor with floating operation capability, and the CMOS transistors, can be formed (step 610). In some implementations, each gate oxide can be simultaneously or sequentially formed. For instance, the gate oxide for the LDMOS transistor can be formed at the same time as the gate oxide of the CMOS transistors so that the LDMOS transistor may establish a similar threshold voltage and gate oxide thickness as those of the CMOS transistors. Alternatively, the gate oxide of the LDMOS transistor can be formed at a different time or with a different thickness than the gate oxide of the CMOS transistors to flexibly allow the LDMOS transistor to be implemented with a dedicated gate oxide thickness larger or smaller than that of the CMOS transistors. In these implementations, when the gate oxide of the LDMOS transistor is formed to be thicker than the gate oxide of the CMOS transistors, the LDMOS transistor can allow higher gate drive in applications where a lower voltage power supply may not be readily available. This flexibility yields optimization of the LDMOS transistor depending on specific requirements of a power delivery application, such as efficiency targets at a particular frequency of operation.

The gate oxide 512 can be formed on the surface 702 of the p-type substrate 502 above the HV n-well 500A. Similarly, the gate oxide 706A of the PMOS transistor (with floating operation capability) and the gate oxide 706B of the NMOS transistor (with floating operation capability) can be formed on the surface of the p-type substrate 502 above the HV n-well 500B. Further, the gate oxide 118 and the gate oxide 134 can be formed on the surface of the p-type substrate 502 above the CMOS n-well 106, and on the surface of the p-type substrate 502 above the CMOS p-well 122, respectively.

Figure 7E:
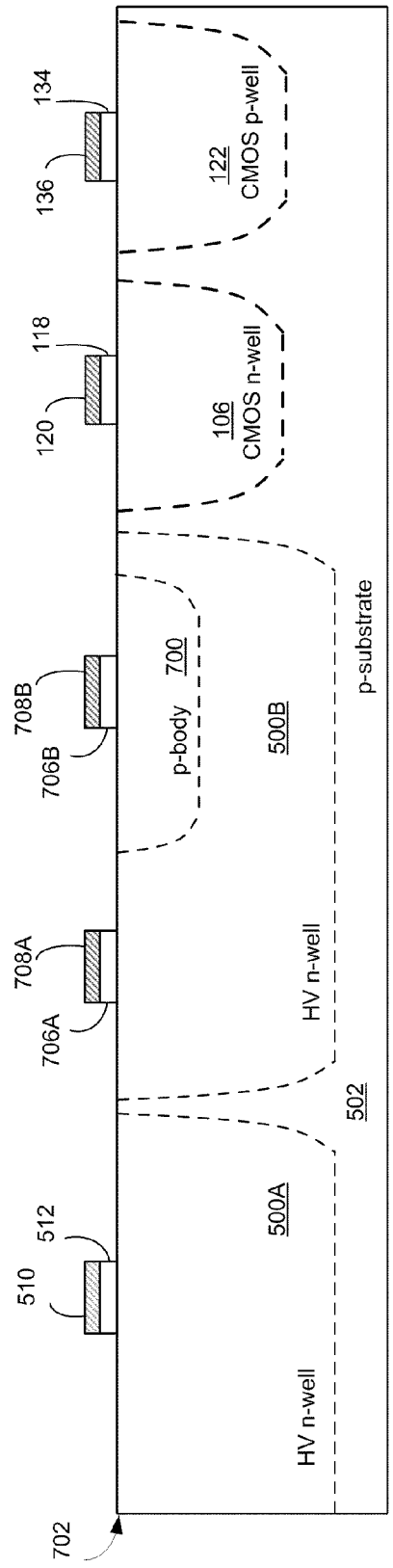

Next, a polysilicon layer is deposited over the gate oxide (step 612). The polysilicon layer can be used as transistor electrodes for interconnection purposes. As shown in FIG. 7E, polysilicon layers 510, 708A and 708B can be deposited over the gate oxide 512, the gate oxide 706A, and the gate oxide 706B, respectively. Also, a polysilicon layer 120 and a polysilicon layer 136 are deposited over the gate oxide 118 formed above the CMOS n-well 106 and the gate oxide 134 formed above the CMOS p-well 122, respectively.

Figure 7F:
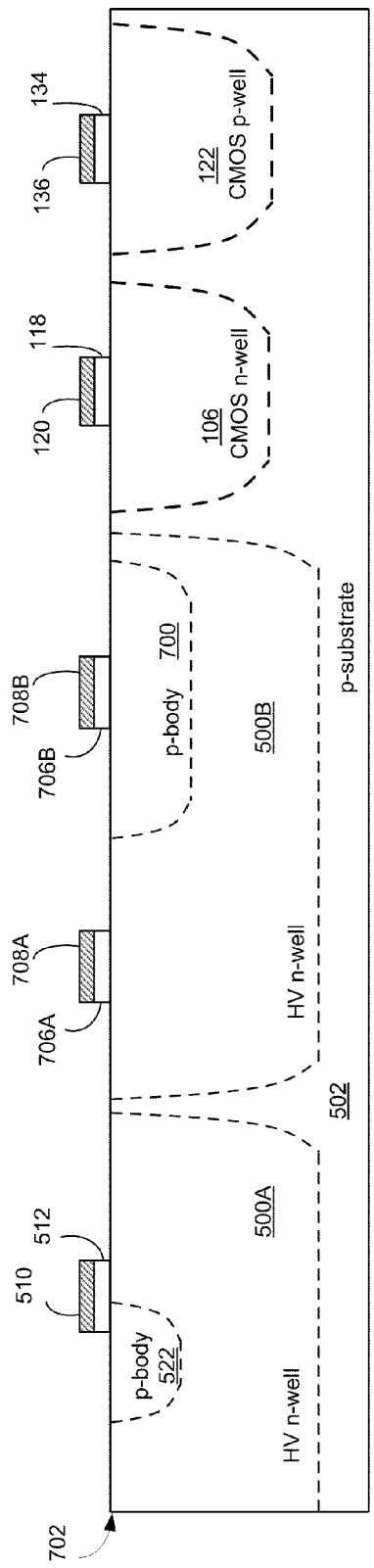

A self-aligned P-body 522 for the source region of the LDMOS transistor is implanted (step 614). As illustrated in FIG. 7F, the P-body 522 is implanted into the HV n-well 500A.

Figure 8A:
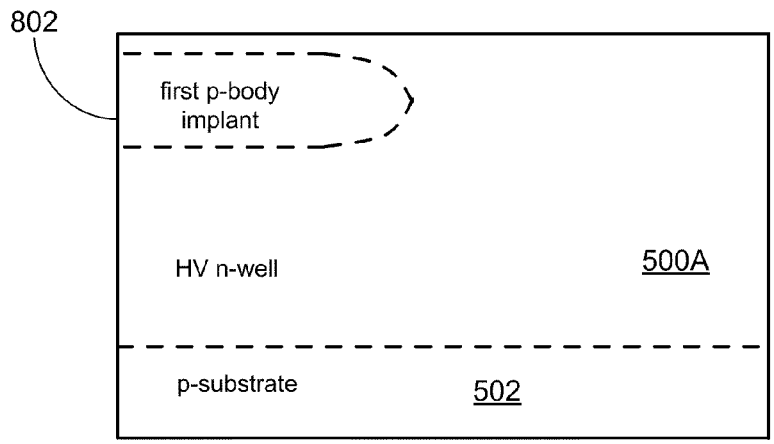
FIGS. 8A-8C illustrate an exemplary P-body implant step of the exemplary process of FIG. 6.

In some implementations, the self-aligned P-body 522 is implanted into the HV n-well 500A in two separate steps to allow for a better control of vertical depth and amount of lateral side diffusion of the P-body. Referring to FIG. 8A, a first P-body implant 802 of the HV n-well 500A can be used to limit the vertical depth of the P-body 522. The vertical depth of the first P-body implant 802 also can control the vertical doping profile underneath the source region (e.g., 506) of the LDMOS transistor, and therefore can determine the source-to-substrate punch-through breakdown voltage $BV_{s\_sub}$ of the LDMOS transistor. The first P-body implant 802 can be a high energy implant. In some implementations, the first P-body implant 802 is implanted using a large-angle tilt (LAT) implant process. The angle implant tilt can be, for example, about or exceed 7 degrees.

Figure 8B:
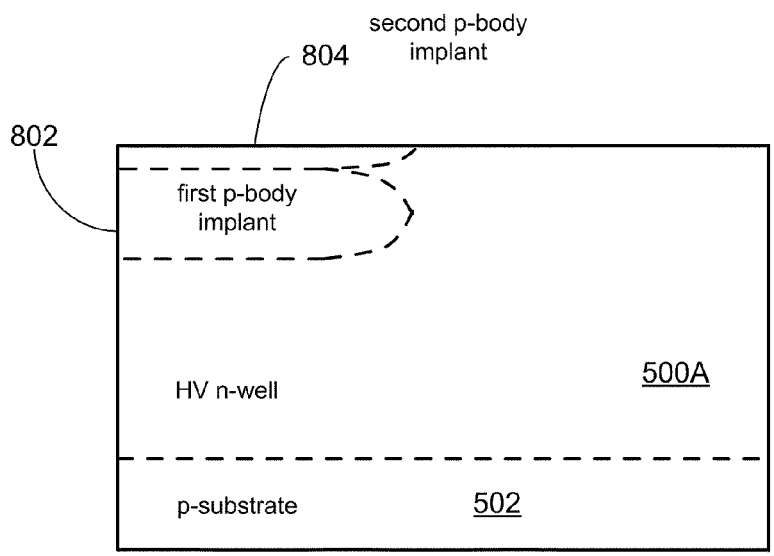
Figure 8C:
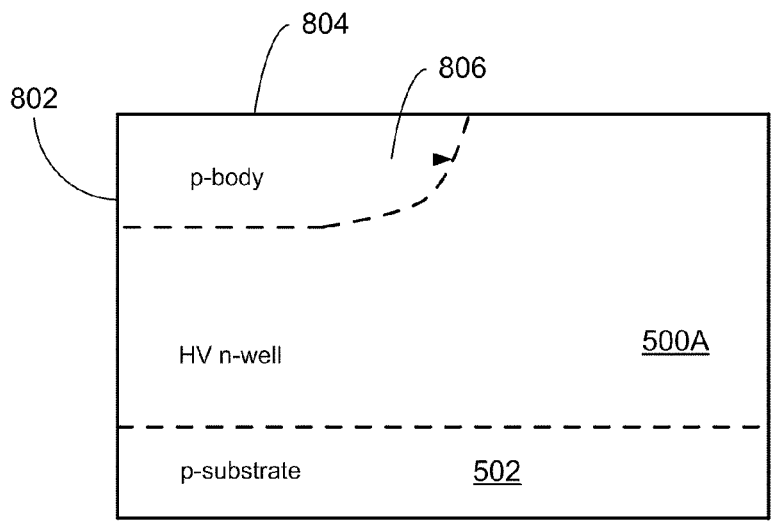

After a first P-body implant 802 is formed, as shown in FIG. 8B, a second P-body implant 804 is implanted over the first P-body implant 802. The second P-body implant 804 can be utilized to control the channel length of the LDMOS transistor. The second P-body implant 804 also can set the surface concentration of the P-body 522 to control the threshold voltage ($V_t$) of the LDMOS transistor. A subsequent P-body drive-in and annealing process that limit the amount of the lateral side diffusion 806 of the resulting P-body (e.g., for further channel length control) is shown in FIG. 8C. In some implementations, the subsequent annealing process is a rapid thermal anneal (RTA) process. A potential advantage of the two-step self-aligned P-body fabricated as disclosed herein is that the process does not require a long P-body drive-in at high-temperatures. Therefore, the process does not significantly affect the CMOS thermal budget.

Figure 7G:
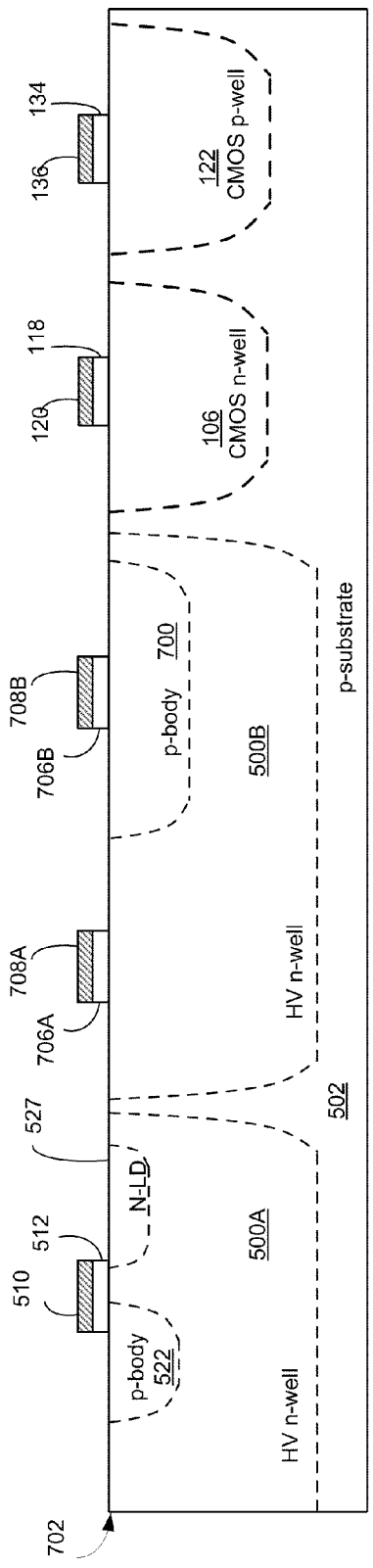

Referring to FIG. 7G, a shallow drain (N-LD) 527 is implanted and diffused into the drain of the LDMOS transistor (step 618). In some implementations, the shallow drain 527 can be implanted before or after the LDMOS gate is formed—i.e., the shallow drain 527 can be non-self aligned or self aligned with respect to the gate 507 of the LDMOS transistor. The shallow drain 527 can be implanted using the LAT implant or a normal angle tilt implant as discussed above.

In some implementations, as demonstrated in FIG. 9A, the N-LD 527 (and the n+ region 525) has a spacing 907 from the P-body 522 that can be controlled by masked gate dimensions. The spacing 907 can be sized such that the N-LD 527 extends a predetermined distance d1 from the LDMOS gate. The predetermined distance d1 can be controlled by mask dimensions. In other implementations, as shown in FIG. 9B, the N-LD 527 (and the n+ region 525) can extend beyond the right edge of the LDMOS gate by a predetermined distance d2 using a drive-in process.

In some implementations, the N-LD 527 shares the same mask as the HV n-well 500A to reduce the number of mask needed for fabricating the LDMOS transistor. Such an approach is possible if the doping concentration of the N-LD 527 is lighter than the P-body 522 so that the extra N-LD implant into the source of the LDMOS transistor does not affect the channel characteristics.

At step 620, implantation for the N-LDS region 520 is performed, followed by the implantation for the n+ regions at step 624. Once the N-LDS region 520 is formed, as shown in FIG. 7H, the LDMOS transistor is implanted with an n+ region 525 at the drain and an n+ region 517 at the source. The n+ regions 710 and 712 are implanted at the drain and source, respectively, of the NMOS transistor with floating operation capability. The n+ regions 128 and 130 also are implanted at the source and drain regions, respectively, of the CMOS p-well 122.

While it is shown that the N-LDS region 520 is implanted prior to implantation for the n+ regions, depending on a desired alignment of the N-LDS with respect to the gate, the order can be reversed so that the N-LDS regions 520 is implanted after implantation of the n+ regions. In either implementations, the N-LDS region 520 can be shallower than the n+ region 517 (i.e., the n+ region 517 extends toward the p-type substrate 502 deeper than the N-LDS region 520).

After the N-LDS region 520 and the n+ regions are formed, p+ regions of the LDMOS transistor, the PMOS transistor with floating operation capability, the NMOS transistor with floating operation capability, and the CMOS transistors, are implanted (step 626). As shown in FIG. 7I, the p+ regions 714A and 714B are implanted at the drain and source, respectively, of the PMOS transistor with floating operation capability. A p+ region 515 is also implanted at the source of the LDMOS transistor. Separate p+ regions 112, 114, are implanted at the source and drain, respectively, of the PMOS transistor. Each of the p+ regions can be formed separately or simultaneously.

FIGS. 7J-7L show the process of step 616 in more detail. Referring to FIG. 7J, after the shallow drain (N-LD) 527 is implanted and diffused into the drain of the LDMOS transistor (e.g., step 614), the N-LDS region 520 is implanted into the source of the LDMOS transistor (step 620). The N-LDS region 520 can be implanted to extend under the gate oxide 512 previously formed on the HV n-well. The N-LDS region 520 may align with an outer boundary (e.g., the boundary away from the drain) of the n+ region 517, and abut the p+ region 515. Alternatively, the N-LDS region 520 may be implanted with a predetermined distance away from the p+ region 515.

Then, as shown in FIG. 7K, a pair of oxide spacers 530 can be formed adjacent to the gate oxide 512 and the polysilicon 510 (step 622). After the oxide spacers are formed, implantation for the n+ regions is performed (step 624). The LDMOS transistor can be implanted with an n+ region at the drain and another n+ region at the source. The n+ region 517 and 525 can be formed over the N-LDS region 520 and the N-LD region 527, respectively, as illustrated in FIG. 7L. The n+ regions also can be implanted at the drain and source of the NMOS transistor with floating operation capability, and at the source and drain regions of the CMOS p-well 122. Depending on a design application, the n+ regions can be performed prior to formation of the oxide spacers.

The p+ region can be formed by a two-step implant in a manner similar to the n+ region. That is, a N-LDS region can be implanted before formation of the oxide spacer, and a p+ region can be implanted after formation of the oxide spacer.

Because the gate may have some finite source/drain overlap, in these implementations, the gate (or gate oxide) can be formed first and then used as a diffusion or implant mask in defining the source and drain regions so as to preclude the source and/or drain from running under the gate oxide. Once the gate is formed, the gate can serve as a mask during implantation of the n+ regions and the P-body so that they are self-aligned with respect to the gate. As shown, n+ regions 517 and 525 of the LDMOS transistors are implanted and self-aligned with respect to the corresponding gate oxide.

In some implementations, only one side (e.g., the source) of the LDMOS transistor includes an N-LDS region. For example, the n+ region 525 can be formed using a one-step process because the drain of the LDMOS transistor does not include a N-LDS region.

In some implementations, steps 602-626 may be performed in the order listed, in parallel (e.g., by the same or a different process, substantially or otherwise non-sequentially), or in reverse order to achieve the same result. For example, after forming the p-type substrate 502, CMOS n-well 106 and CMOS p-well 122 can be implanted prior to implanting the HV n-wells 500A and 500B. As another example, the p+ regions can be formed prior to implanting the n+ regions, and the N-LDS region can be formed prior to implanting the N-LD region. As yet another example, the N-LD region 527 can be implanted prior to forming the gate oxide or implanting the self-aligned P-body.

In other implementations, depending on a particular design application, one or more of the steps 602-626, or combinations thereof can be bypassed. In yet other implementations, any of the steps 602-626 may be performed by two or more processes rather than by a single process.

However, the order discussed above is not limited to that shown. For example, the n+ region 517 can be implanted prior to forming the N-LDS region 520, such that the N-LDS region 520 self-aligns with the gate oxide 512 and overlaps the n+ region 517 after the N-LDS region 520 is subsequently formed.

In some implementations, steps 602-626 may be performed in the order listed, in parallel (e.g., by the same or a different process, substantially or otherwise non-sequentially), or in reverse order to achieve the same result. For example, n+/p+ regions can be implanted prior to forming the oxide spacers. As another example, the N-LDS region can be implanted prior to implanting the N-LD region. As yet another example, the N-LDS region can be formed prior to or subsequently after any one of the steps 618, 622, 624 and 626.

In other implementations, depending on a particular design application, one or more of the steps 602-626, or combinations thereof can be bypassed. In yet other implementations, any of the steps 602-626 may be performed by two or more processes rather than by a single process, performed simultaneously or sequentially.

The processes 600 provides a potential advantage over conventional techniques because any channel length variation due to misalignment of the P-body 522 and n+ region 518 can be mitigated and compensated by a greater critical dimension (CD) control of the process 600.

Also, PMOS transistors are typically formed on a CMOS n-well. In applications where a shift in threshold voltages of CMOS transistors is tolerable, a PMOS transistor can be directly implemented in an HV n-well, such as the PMOS transistor with floating operation capability in the example of FIG. 7H. Implementing a PMOS transistor directly in an HV n-well has the advantage of allowing the process 600 to skip a CMOS n-well implant and masking step (while maintaining its thermal cycle), thereby potentially lowering the overall process manufacturing cost.

Figure 7M:
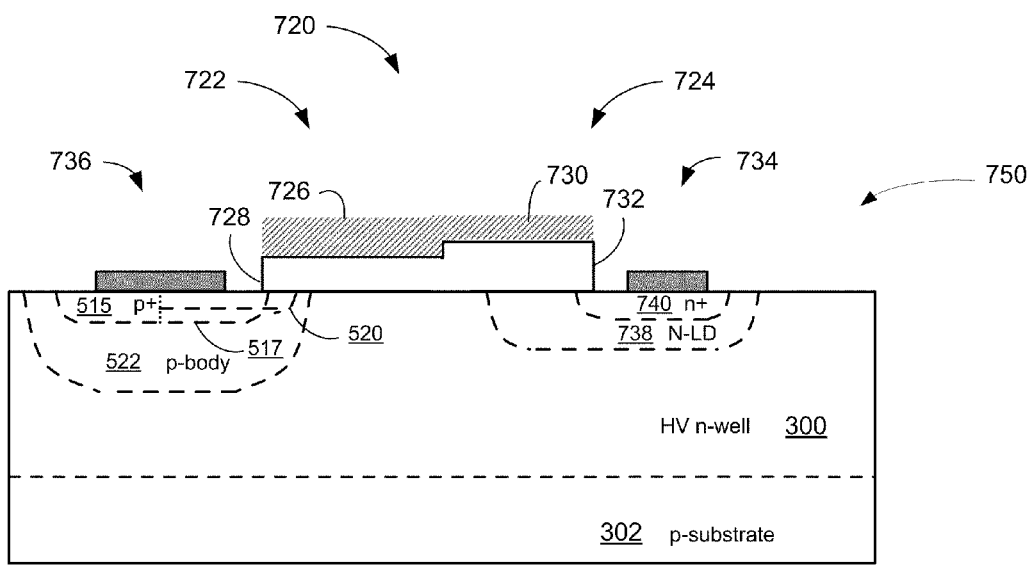

While a single gate has been illustrated, the LDMOS transistor can include more than one gate. FIG. 7M illustrates a LDMOS having a dual gate oxide. Referring to FIG. 7M, the LDMOS transistor 750 includes a drain region 734, a source region 736, and a dual gate 720. The dual gate 720 includes a first gate region 722 and a second gate region 724. In one implementation, the first gate region 722 is a controlled gate and the second gate region 724 is non-controlled. A controlled gate is a gate that receives a voltage that can activate—i.e., turn on or off—a corresponding transistor. Second gate region 724 can float or be controlled by the same signal as the first gate region 722. The first gate region 722 includes a conductive layer 726 and an oxide layer 728, and the second gate region 724 includes a conductive layer 730 and an oxide layer 732. Each of the conductive layers 726, 730 can be a layer of polysilicon. As shown in FIG. 7M, the oxide layer 732 is thicker than oxide layer 728. The thinner oxide layer provided by the oxide layer 728 permits the LDMOS transistor 750 to be controlled by a lower gate voltage relative to a transistor having a controlled gate with a thicker oxide layer. As shown, the first gate region 722 has a thinner oxide layer with respect to the second gate region 724 sand the first gate region 722 abuts the second gate region 724.

Referring again to FIG. 7M, drain region 734 includes an n-doped n+ region 740 and an n-doped shallow drain (N-LD) region 738. In some implementations, the N-LD region 738 is self-aligned with respect to the second gate 726. In these implementations, the N-LD region 738 does not completely extend underneath the second gate 724. If desired, the N-LD region 738 can also be non-self aligned.

As a PMOS transistor can be directly implemented in the HV n-well, an NMOS transistor can similarly be implemented within a P-body implant, such as the NMOS transistor with floating operation capability in the example of FIG. 7H. A sub-micron CMOS process can therefore skip a conventional CMOS P-well implant and masking step (while maintaining its thermal cycle) to lower the overall process manufacture cost.

Figure 10:
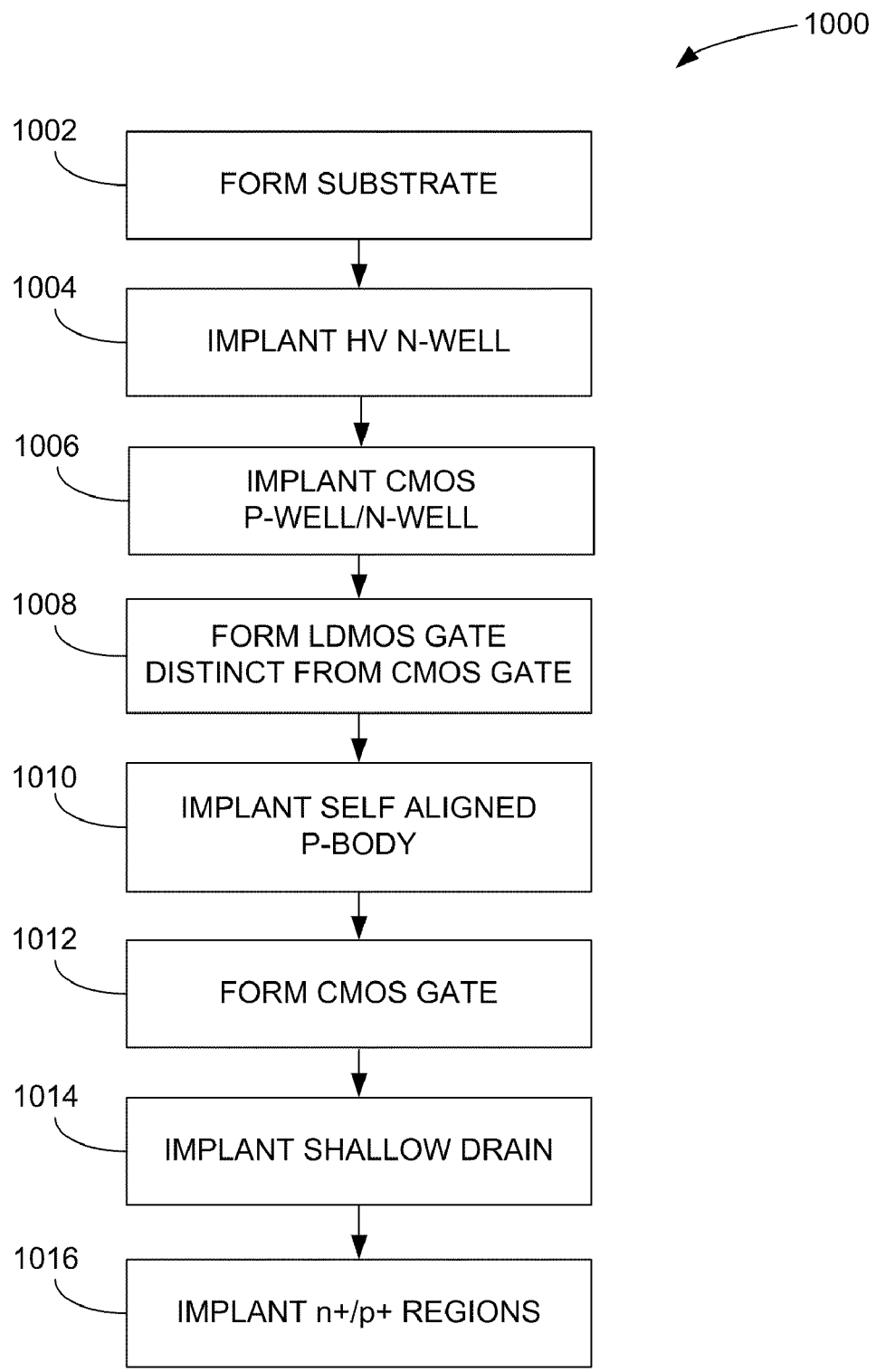
FIG. 10 is a flow diagram illustrating an alternative process for manufacturing a semiconductor transistor including an LDMOS transistor according to a process that is compatible with a sub-micron CMOS process.

FIG. 10 illustrates an alternative process 1000 of fabricating an LDMOS transistor that is compatible with a sub-micron CMOS process.

Figure 11A:
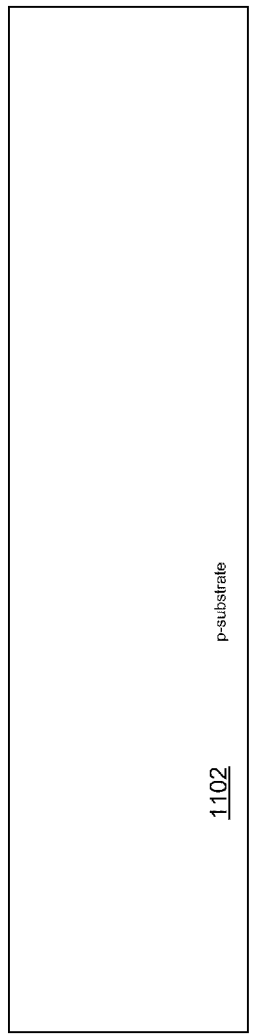
Figure 11B:
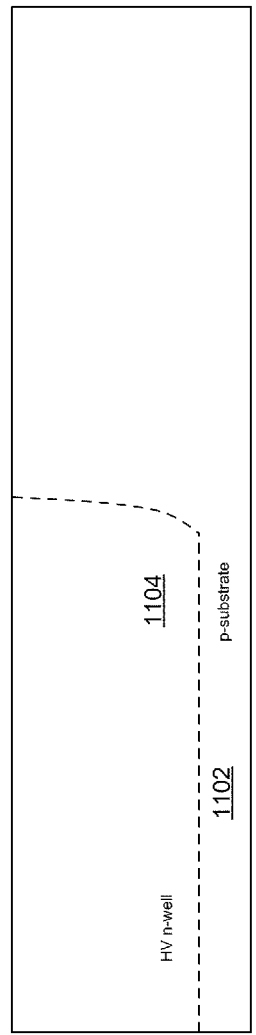
Figure 11C:
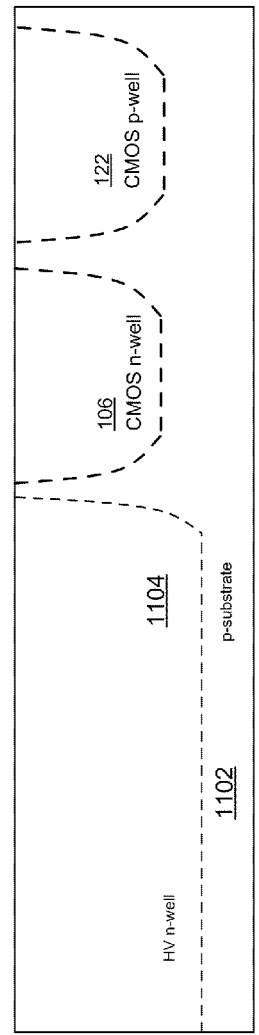

The process 1000 begins with forming a substrate (step 1002). The substrate can be a p-type substrate or an n-type substrate. Referring to the example of FIG. 11A, a semiconductor layer consisting of a p-type substrate 1102 is formed. An HV n-well for the LDMOS transistor is implanted into the substrate (step 1004). The implanted well can be an HV (high voltage) n-well, such as HV n-well 1104 (FIG. 11B). A CMOS n-well 106 for a conventional PMOS transistor and a CMOS p-well 122 for a conventional NMOS transistor are implanted into the substrate (step 1006) (FIG. 11C). An LDMOS gate oxide and polysilicon is formed for the LDMOS transistor (step 1008) The LDMOS gate oxide and polysilicon is distinct from the gate oxide and polysilicon of the conventional CMOS transistors (step 1008)—i.e., the gate of the LDMOS transistor is formed separate from and prior to the formation of the gate of the conventional CMOS transistors being fabricated at the same time. Referring to the example of FIG. 11D, the LDMOS gate oxide 1106 is formed on the surface 1108 of the substrate on the HV n-well 1104, and a polysilicon layer 1110 is deposited over the LDMOS gate oxide.

A self aligned P-body 1112 (with respect to the gate of the LDMOS transistor) for the drain region of the LDMOS transistor is implanted (step 1010). As shown in FIG. 11E, the P-body 1112 is implanted into the HV n-well 1104. The self aligned P-body 1112 can be implanted into the HV n-well in two steps, as discussed above, to allow for a better control of the vertical depth and the amount of lateral side diffusion of the P-body. The P-body drive-in and annealing process can occur prior to, for example, formation of the gate oxide of the conventional CMOS transistors such that a redesign of the thermal cycle allocated to sub-micron CMOS processes (e.g., process step 206) is not required.

Figure 11H:
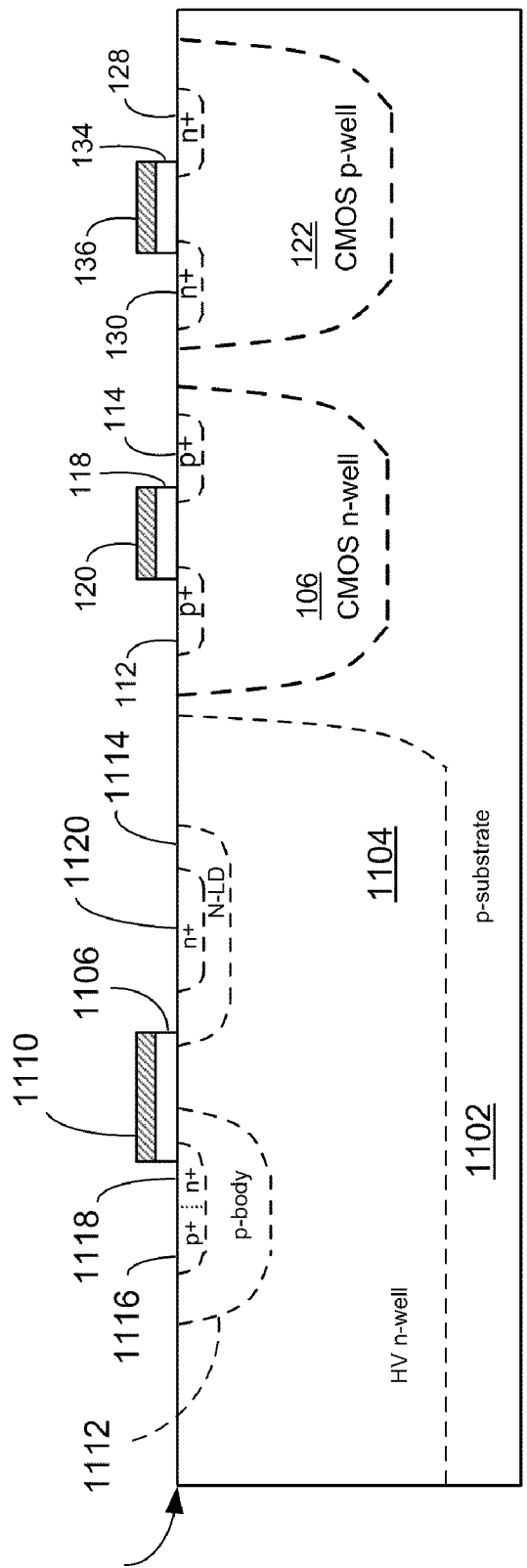

The gate of the conventional CMOS transistors is formed (step 1012). Referring to FIG. 11F, the gate oxide 118 of the conventional PMOS transistor is formed on the surface of the substrate on the CMOS n-well 106, and the gate oxide 134 of the conventional NMOS transistor is formed on the surface of the substrate on the CMOS p-well 122. A polysilicon layer 120 is deposited over the conventional PMOS gate oxide 118, and a polysilicon layer 136 is deposited over the conventional NMOS gate oxide 134. A shallow drain is implanted and diffused into the drain of the LDMOS transistor (step 1014). The shallow drain can be non-self aligned or self aligned. In the example of FIG. 11G, the shallow drain is the n-doped shallow drain N-LD 1114. The N-LD implant can share the same mask as the HV n-well to reduce the mask count. The n+ regions and p+ regions of the LDMOS transistor are implanted (step 1016). In one implementation, during this step, n+ and p+ regions associated with the CMOS transistors are also implanted. As shown in FIG. 11H, a p+ region 1116 and an n+ region 1118 are implanted at the source of the LDMOS transistor. An n+ region 1120 is also implanted at the drain of the LDMOS transistor. Further, p+ regions 112, 114, are implanted at the source and drain, respectively, of the conventional PMOS transistor, and n+ regions 128, 130 are implanted at the source and drain regions, respectively, of the conventional NMOS transistor. As in process 600, formation of the p+ regions and the n+ regions can occur through a 3 step process as described above in connection with a sub-micron CMOS process.

LDMOS Transistor Performance

The three-way performance tradeoff between the on-resistance $R_{dson}$, the drain-to-substrate breakdown voltage $BV_{d\_s}$, and the source-to-substrate punch-through breakdown voltage $BV_{s\_sub}$ of an LDMOS transistor can be improved by using a triple diffusion (N+/N-LD/HV n-well) drain structure that can be fabricated through a process compatible with a typical sub-micron CMOS process.

LDMOS transistors can be fabricated on a common HV n-well. A main design requirement of the common HV n-well is to provide an optimized vertical doping profile to achieve the highest drain-to-substrate breakdown voltage $BV_{d\_sub}$ and source-to-substrate punch-through breakdown voltage $BV_{s\_sub}$ as required among all LDMOS transistors being fabricated. For a high voltage LDMOS transistor—e.g., greater than 30V—the HV n-well is generally deeper and lighter doped than a regular (conventional) n-well for the CMOS transistor. Since the HV n-well is implanted at the beginning of the processes 600, 1000, its formation has no impact on fixed thermal budgets (that have been optimized for the mass production of sub-micron CMOS devices) allocated to sub-micron CMOS processes. An extra drive-in for the HV n-well can be accommodated if a co-drive-in with a CMOS n-well is not sufficient. Generally, a deep HV n-well with retrograded vertical doping profile offers the best drain-to-substrate breakdown voltage $BV_{d\_sub}$ and source-to-substrate punch-through breakdown voltage $BV_{s\_sub}$ performances.

The shallow self aligned diffused drain implant and diffusion (N-LD 512) has a spacing from the P-body implant that is controlled by masked gate dimensions. A main design requirement of the N-LD is to achieve an optimized lateral doping profile to achieve the best performance tradeoff between the on-resistance $R_{dson}$ and the drain-to-substrate breakdown voltage $BV_{d\_sub}$ of the LDMOS transistor. Since the N-LD is a shallow diffusion, it has little impact on the vertical doping profile of the LDMOS transistor, and therefore, has little impact on the drain-to-substrate breakdown voltage $BV_{d\_sub}$ and source-to-substrate breakdown voltage $BV_{s\_sub}$ characteristics of the transistor. The spacing of the N-LD implant from the P-body allows for a better control of the drain-to-substrate breakdown voltage $BV_{d\_sub}$ by lowering the doping levels at the boundary of the HV n-well/P-body junction. Moreover, such a spacing results in improved hot carrier injection (HCI) stability of the LDMOS transistor. Generally, a graded lateral doping profile in the drain region of the LDMOS transistor (e.g., as shown in FIGS. 7H and 9) offers a better performance tradeoff between the on-resistance $R_{dson}$ and the drain-to-substrate breakdown voltage $BV_{d\_sub}$ than a uniform lateral doping profile. A graded lateral doping profile can be achieved by using a large-angle tilt (LAT) N-LD implant. Furthermore, since a deep drive-in is not required for the N-LD implant, the N-LD can be self aligned to the gate—i.e., implanted after formation of the LDMOS gate, including gates of the CMOS transistors. Therefore, the addition of the N-LD implant has substantially no impact on fixed thermal budgets associated with CMOS process steps (e.g., process step 206).

The above description describes LDMOS transistors having varied drain-to-substrate breakdown voltage $BV_{d\_sub}$ ratings that can be fabricated in processes compatible with a typical sub-micron CMOS process.

The following description describes alternative examples of LDMOS transistors that can be fabricated through processes, such as processes 600, 1000, that are compatible with a sub-micron CMOS process.

CMOS N-Well as HV N-Well

An interesting feature of conventional low voltage CMOS transistors—e.g., 3.3V to 5V—fabricated within a sub-micron CMOS process is that the sub-micron CMOS process typically includes implanting a CMOS n-well having a breakdown voltage around 30V. For LDMOS transistors designed for applications of a medium voltage range (e.g., 5V to 25V), these LDMOS transistors can be fabricated on a regular CMOS n-well, thus eliminating a separate HV n-well implant and masking step—i.e., steps 604, 1004 of processes 600, 1000, respectively. The remaining steps of processes 600, 1000 can be unaltered.

Figure 12:
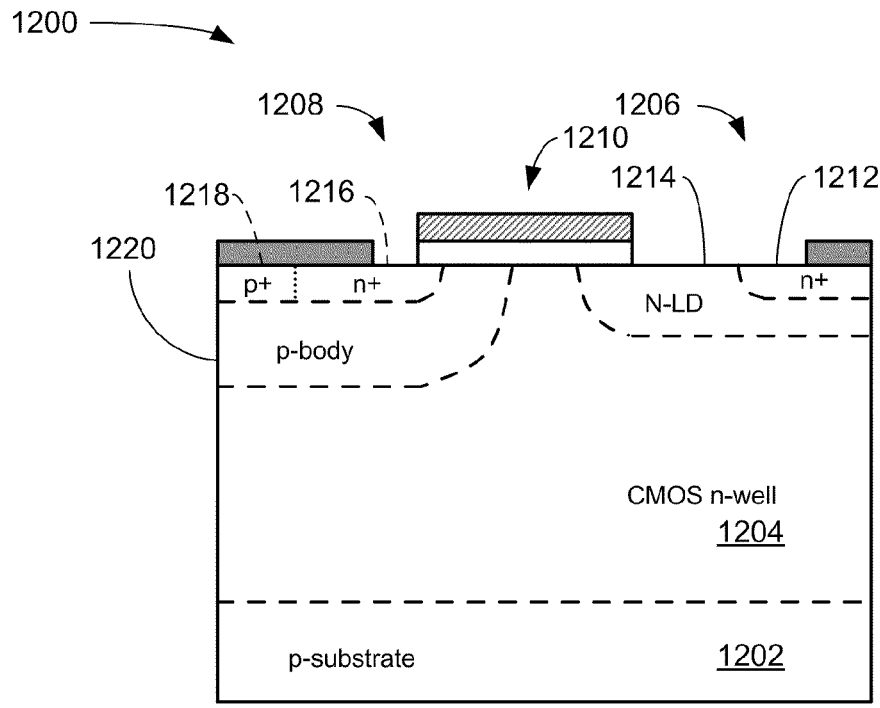
FIG. 12 is a schematic cross-sectional view of an LDMOS transistor having a CMOS n-well implant.

FIG. 12 shows an example LDMOS transistor 1200 fabricated on a p-type substrate 1202 having a CMOS n-well implant 1204 for the LDMOS transistor. The LDMOS transistor 1200 includes a drain region 1206, a source region 1208, and a gate 1210. The drain region 1206 includes an n-doped n+ region 1212 and an n-doped shallow drain (N-LD) 1214. The source region 1208 includes an n-doped n+ region 1216, a p-doped p+ region 1218, and a p-doped P-body 1220.

CMOS N-Well as N-LD

For LDMOS transistors designed for application in a high voltage range, the HV n-well will typically be much deeper than the regular CMOS n-well. It is therefore possible to substitute the CMOS n-well for the N-LD, thus eliminating the N-LD implant and masking step—i.e., steps 618, 1014 of processes 600, 1000, respectively. Therefore, in processes 600, 1000 above, a CMOS n-well can be implanted before the gate of the LDMOS transistor is formed, and the CMOS n-well can serve as the shallow drain and would be non-self aligned with respect to the gate. The remaining steps of processes 600, 1000 can be unaltered.

Figure 13:
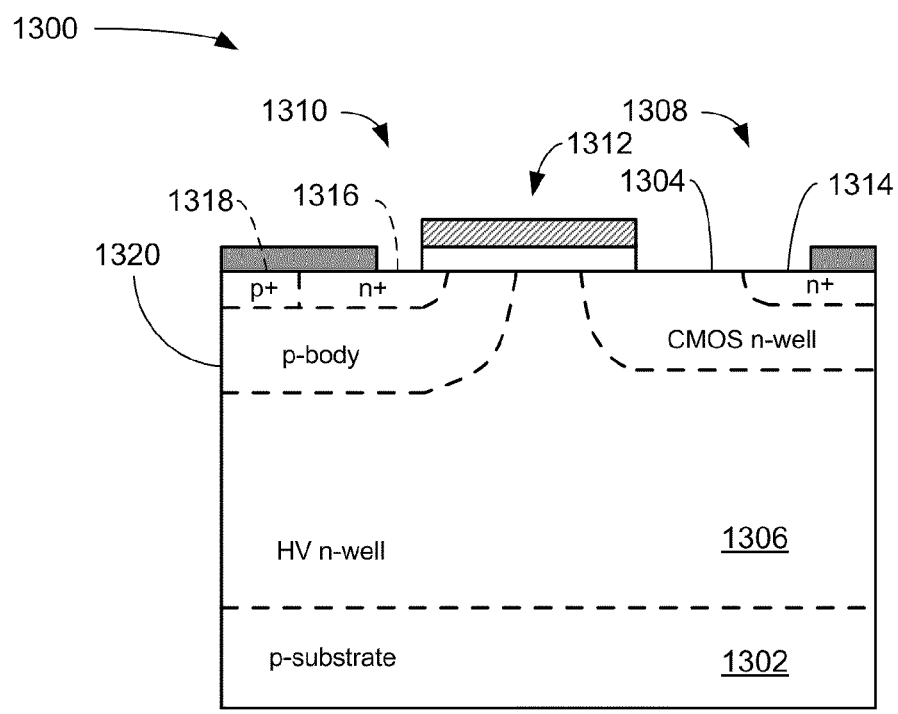
FIG. 13 is a schematic cross-sectional view of an LDMOS transistor having a CMOS n-well implant as a shallow drain.

FIG. 13 shows an example LDMOS transistor 1300 fabricated on a p-type substrate 1302 having a CMOS n-well 1304 as the shallow drain. The LDMOS transistor 1300 has an HV n-well implant 1306 for the transistor. The LDMOS transistor 1300 includes a drain region 1308, a source region 1310, and a gate 1312. The drain region 1308 includes an n-doped n+ region 1314 and an n-doped shallow drain (CMOS n-well) 1304. The source region 1310 includes an n-doped n+ region 1316, a p-doped p+ region 1318, and a p-doped P-body 1320.

DDD as N-LD

In applications where the sub-micron CMOS process includes fabrication of a DDD (Double Doped Drain) HV-CMOS transistor module, the same DDD implant can be implemented as the shallow drain of the LDMOS transistor to modulate the resistance of the drain, thus eliminating the N-LD implant and masking steps 618, 1014 described above. The remaining steps of processes 600, 1000 can be unaltered. The DDD implant can be self aligned or non-self aligned with respect to the LDMOS gate. In addition, the DDD implant can have an offset from the P-body implant such that the DDD implant extends a predetermined distance d from the LDMOS gate.

Figure 14:
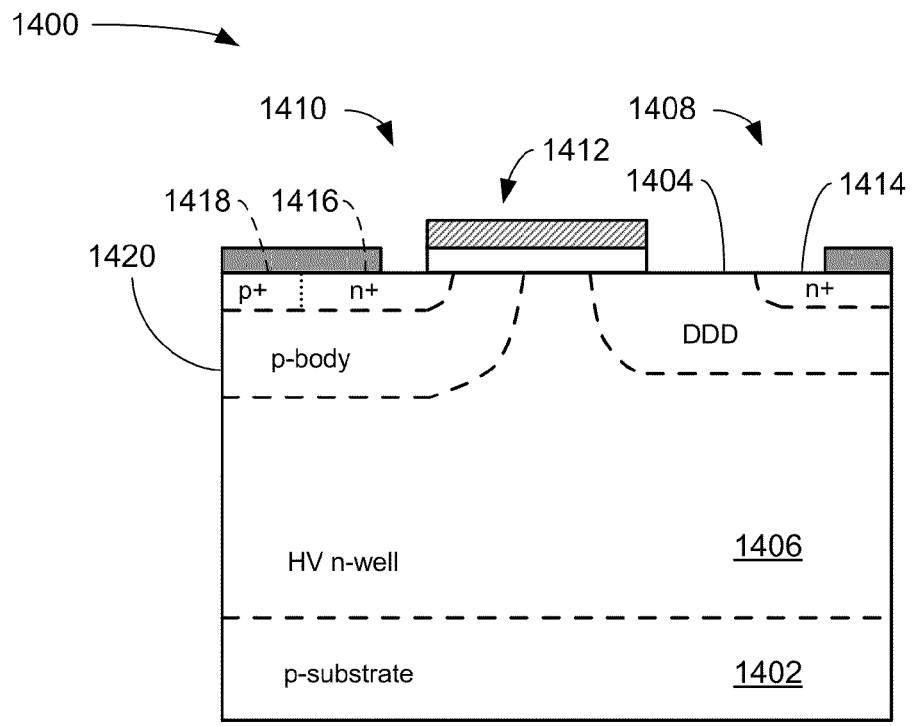
FIG. 14 is a schematic cross-sectional view of an LDMOS transistor having a DDD implant as a shallow drain.

FIG. 14 shows an example LDMOS transistor 1400 fabricated on a p-type substrate 1402 having a DDD implant 1404 as the shallow drain. The LDMOS transistor 1400 has a CMOS n-well implant 1406 for the transistor. The LDMOS transistor 1400 includes a drain region 1408, a source region 1410, and a gate 1412. The drain region 1408 includes an n-doped n+ region 1414 and an n-doped shallow drain (CMOS n-well) 1404. The source region 1410 includes an n-doped n+ region 1416, a p-doped p+ region 1418, and a p-doped P-body 1420.

LDD as N-LD

In a conventional sub-micron CMOS process, a LDD (Lightly Doped Drain) implant and spacer formation step can be introduced to improve NMOS transistor ruggedness against hot electron degradation. In one implementation, the LDD implant can be used as the shallow drain for the LDMOS transistor, thus eliminating the N-LD implant and masking steps 618, 1014 of processes 600, 1000, respectively. The remaining steps of processes 600, 1000 can be unaltered.

Figure 15:
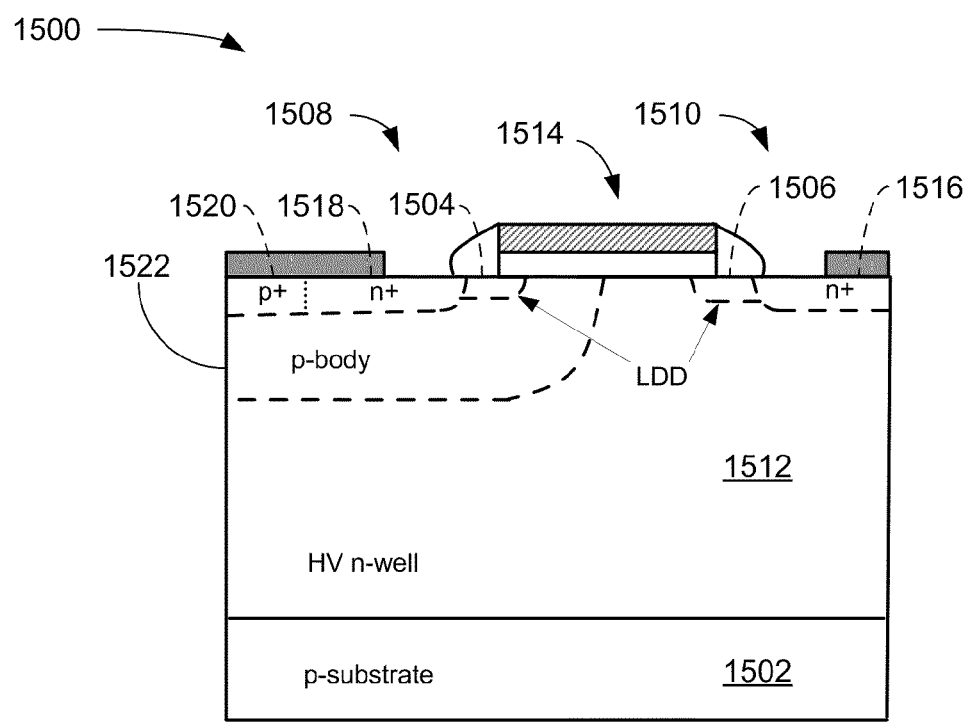
FIG. 15 is a schematic cross-sectional view of an LDMOS transistor having an LDD diffused into source and drains regions of the transistor.

FIG. 15 shows an example of an LDMOS transistor 1500 fabricated on a p-type substrate 1502 having an LDD 1504, 1506 diffused into the source region 1508 and drain region 1510, respectively of the LDMOS transistor. The LDMOS transistor 1500 has an HV n-well implant 1512 for the LDMOS transistor. The LDMOS transistor also includes a gate 1514. The drain region 1510 further includes an n-doped n+ region 1516. The source region 1508 also includes an n-doped n+ region 1518, a p-doped p+ region 1520, and a p-doped P-body 1522.

N-LD Implant Defined by N+ Slit Mask

In one implementation, a graded shallow drain surface implant is achieved by utilizing a slit mask to create multiple standard n+ implants spaced apart relative to each other along the surface of the LDMOS transistor in the drain region, thus eliminating the N-LD implant and masking step—i.e., steps 618, 1014 described above. The multiple n+ implants in the drain region results in an overall lower doping through dopant-side diffusion. This implementation is particularly suited for LDMOS transistors with a high breakdown voltage specification. The remaining steps of processes 600, 1000 can be unaltered.

Figure 16:
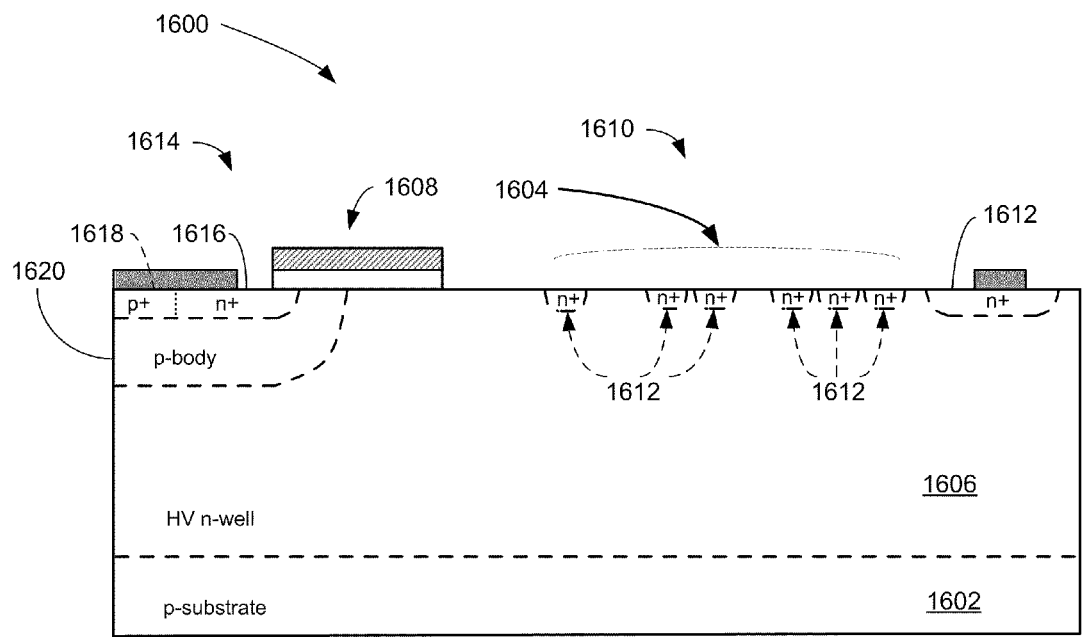
FIG. 16 is a schematic cross-sectional view of an LDMOS transistor having a graded shallow drain implant.

FIG. 16 illustrates an example of an LDMOS transistor 1600 fabricated on a p-type substrate 1602 having a graded shallow drain surface implant 1604. The LDMOS transistor 1600 has an HV n-well implant 1606 for the transistor. The LDMOS transistor also includes a gate 1608. The drain region 1610 further includes n-doped n+ regions 1612. The source region 1614 includes an n-doped n+ region 1616, a p-doped p+ region 1618, and a p-doped P-body 1620.

P-Type LDMOS Transistor

Figure 17:
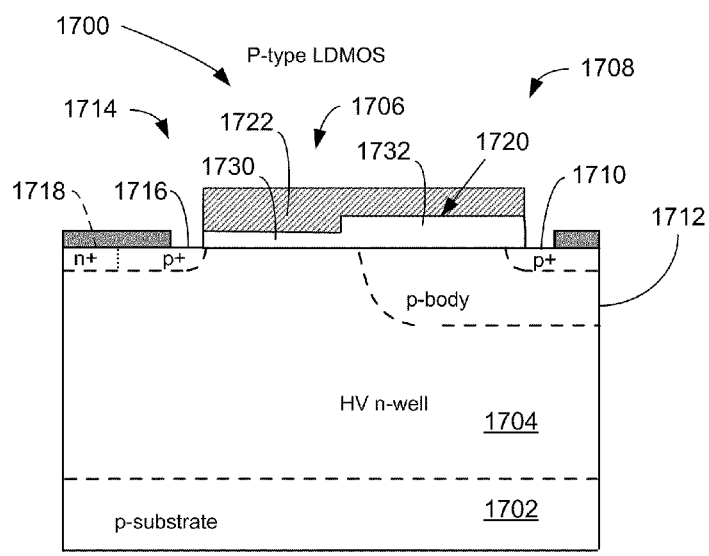
FIG. 17 is a schematic cross-sectional view of a p-type LDMOS transistor.

A p-type high voltage LDMOS transistor can be fabricated. FIG. 17 shows an example a p-type LDMOS transistor 1700 fabricated on a p-type substrate 1702. The LDMOS transistor 1700 has an HV n-well implant 1704 for the transistor. The LDMOS transistor also includes a gate 1706. The drain region 1708 include a p-doped p+ region 1710 and a p-doped floating P-well 1712. The floating P-well 1712 can be self-aligned or non-self-aligned. The source region 1714 includes a p-doped p+ region 1716, and an n-doped n+ region 1718. In one implementation, the gate oxide has a uniform thickness (oxide regions 1730 and 1732 have the same thickness). In another implementation, the oxide region 1730 is a thin gate oxide and the oxide region 1732 is a thicker gate oxide. In another implementation, the oxide region 1730 is a thin gate oxide and the oxide region 1732 is a thicker field oxide. While the gate 1706 is shown with a dual gate oxide, if desired, the gate 1706 can be formed as a single uniform gate.

As with the LDMOS transistor illustrated in FIG. 5A, the p-type LDMOS transistor 1700 is fabricated with a non-self aligned P-body implant 1712. More generally, a common feature of the LDMOS transistors illustrated in FIGS. 12-17 is that the P-body implant is formed prior to gate formation of conventional CMOS transistors. This ensures that the LDMOS transistors can be fabricated in a process that is compatible with a sub-micron CMOS process having fixed parameters that have been optimized for the mass production of sub-micron CMOS devices.

The availability of complementary p-type LDMOS transistor simplifies the design of level shift circuits. The p-type LDMOS transistor, as with each of the LDMOS transistors described above, can be implemented with either a thick or thin gate oxide. Referring again to FIG. 17, the p-type LDMOS transistor 1700 is implemented with a thick gate oxide 1720. For example, when an LDMOS transistor, such as LDMOS transistor 416 (FIG. 5A) is implemented with a high voltage gate—i.e., a gate with a thick gate oxide—a standard high-side p-type transistor (e.g., a PMOS transistor) can be implemented within a switching regulator circuit, thus obviating a need for high-side gate drive considerations. Such an approach results in a hybrid switching regulator, with a low-side LDMOS transistor and a high-side PMOS transistor that minimizes dynamic capacitive losses associated with a high-side PMOS pull-up transistor, as illustrated in the switching regulator 400 of FIG. 4. The low-side LDMOS transistor can have an optimized on-resistance $R_{dson}$ (thin or thick gate oxide). The high-side PMOS transistor can be designed such that dynamic capacitive losses typically associated with high-side PMOS pull-up transistors is minimized. In typical DC-DC conversion applications, in which the conduction duty of the high-side switch is relatively low, the on-resistance $R_{dson}$ of the high-side transistor is a secondary consideration.

Figure 18:
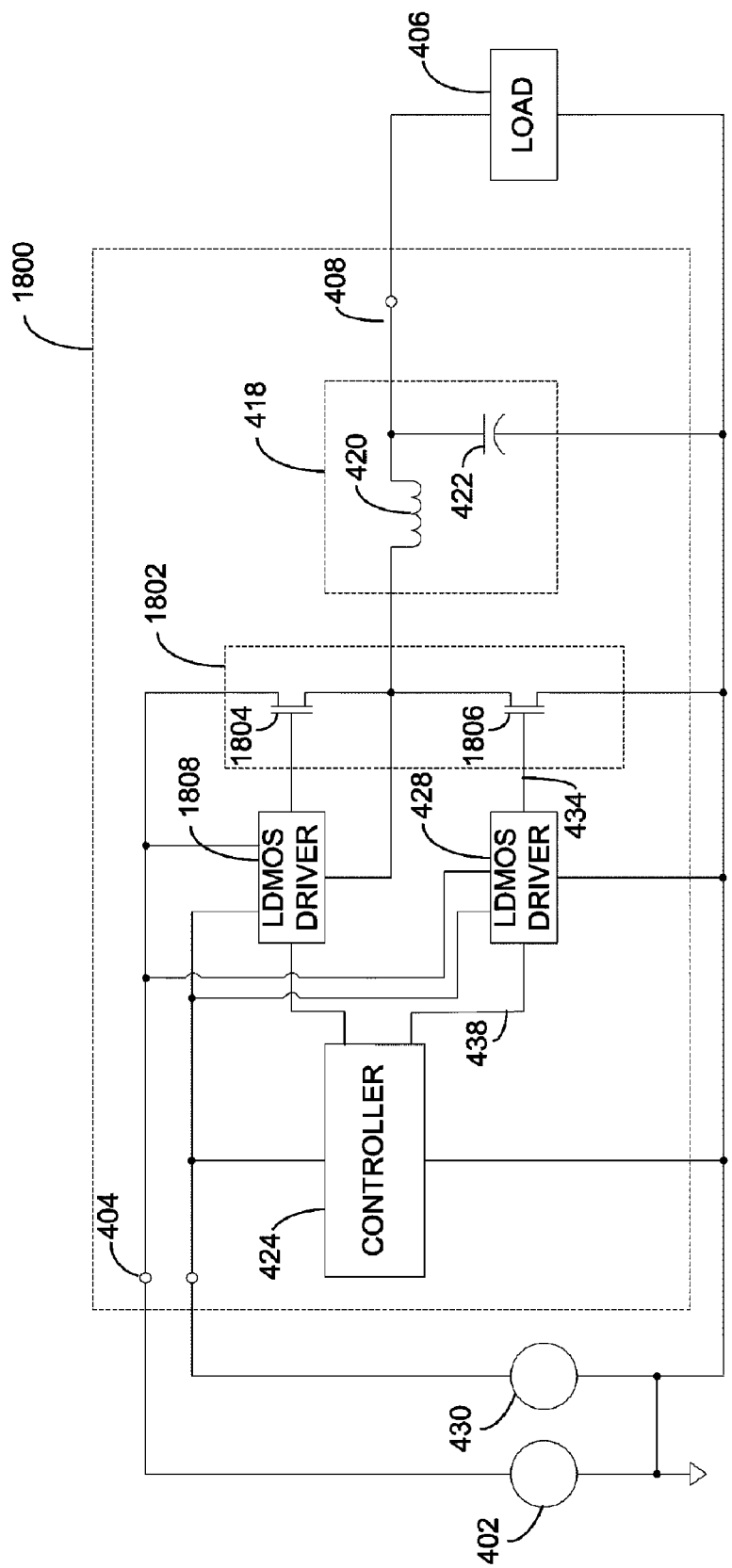
FIG. 18 is a schematic cross-sectional view of a switching circuit including a switching circuit having a high-side LDMOS transistor and a low-side LDMOS transistor.

FIG. 18 illustrates a non-hybrid switching regulator 1800 having a switching circuit 1802 that includes a high-side LDMOS transistor 1804 and a low-side LDMOS transistor 1806. The LDMOS transistors 1804, 1806 can be fabricated through process 600 or 1000. The switching regulator 1800 operates in similar fashion to the switching regulator 400 (FIG. 4). However, the switching regulator 1800 includes an LDMOS driver 1808 to drive the high-side LDMOS transistor 1804. Generally, the LDMOS driver 1808 cannot be fabricated using conventional CMOS transistors. However, using through processes 600, 1000, the LDMOS driver 1808 can be fabricated using PMOS transistors with floating operation capability and NMOS transistors with floating operation capability. LDMOS driver 428 can be fabricated using conventional CMOS transistors, or using PMOS transistors with floating operation capability and NMOS transistors with floating operation capability. Controller 424 is typically fabricated using conventional CMOS transistors.

Other Device Structures

NPN Transistor

Figure 19:
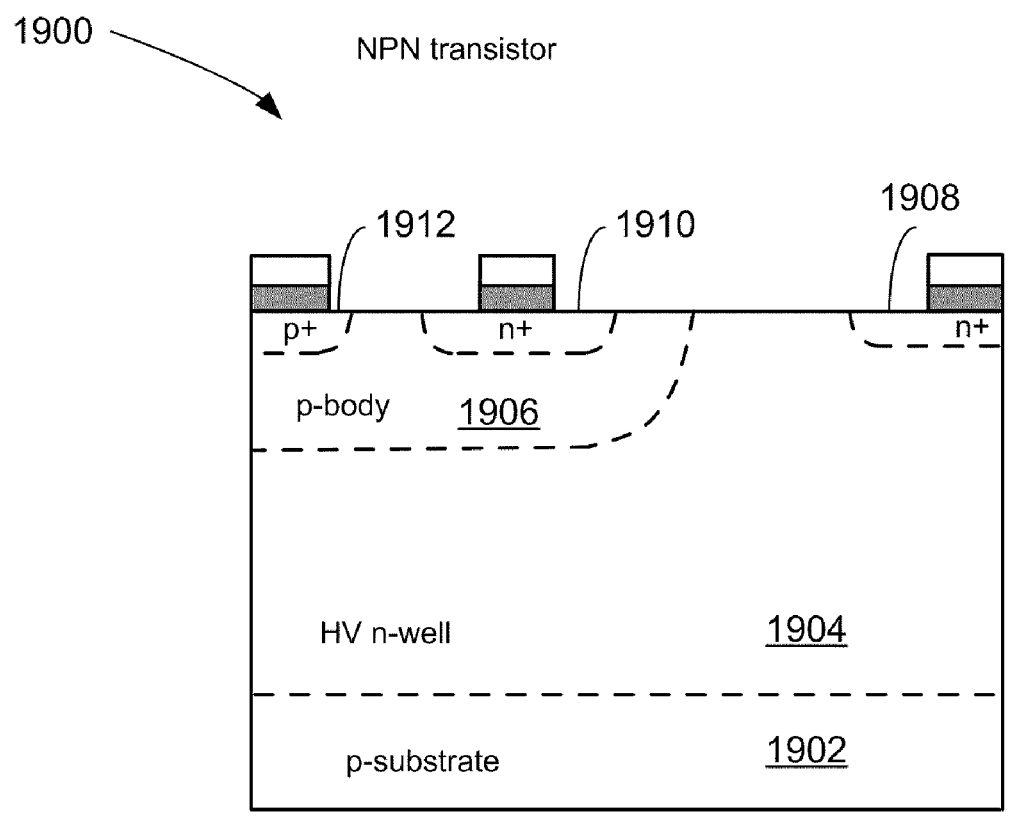
FIG. 19 is a schematic cross-sectional view of a NPN transistor.

Generally, only PNP transistors can be fabricated in a typical sub-micron CMOS process. However, process 600 can be modified to allow fabrication of an NPN transistor. FIG. 19 shows a cross-sectional view of an example NPN transistor 1900 that can be fabricated through a process compatible with a sub-micron CMOS process.

Figure 20:
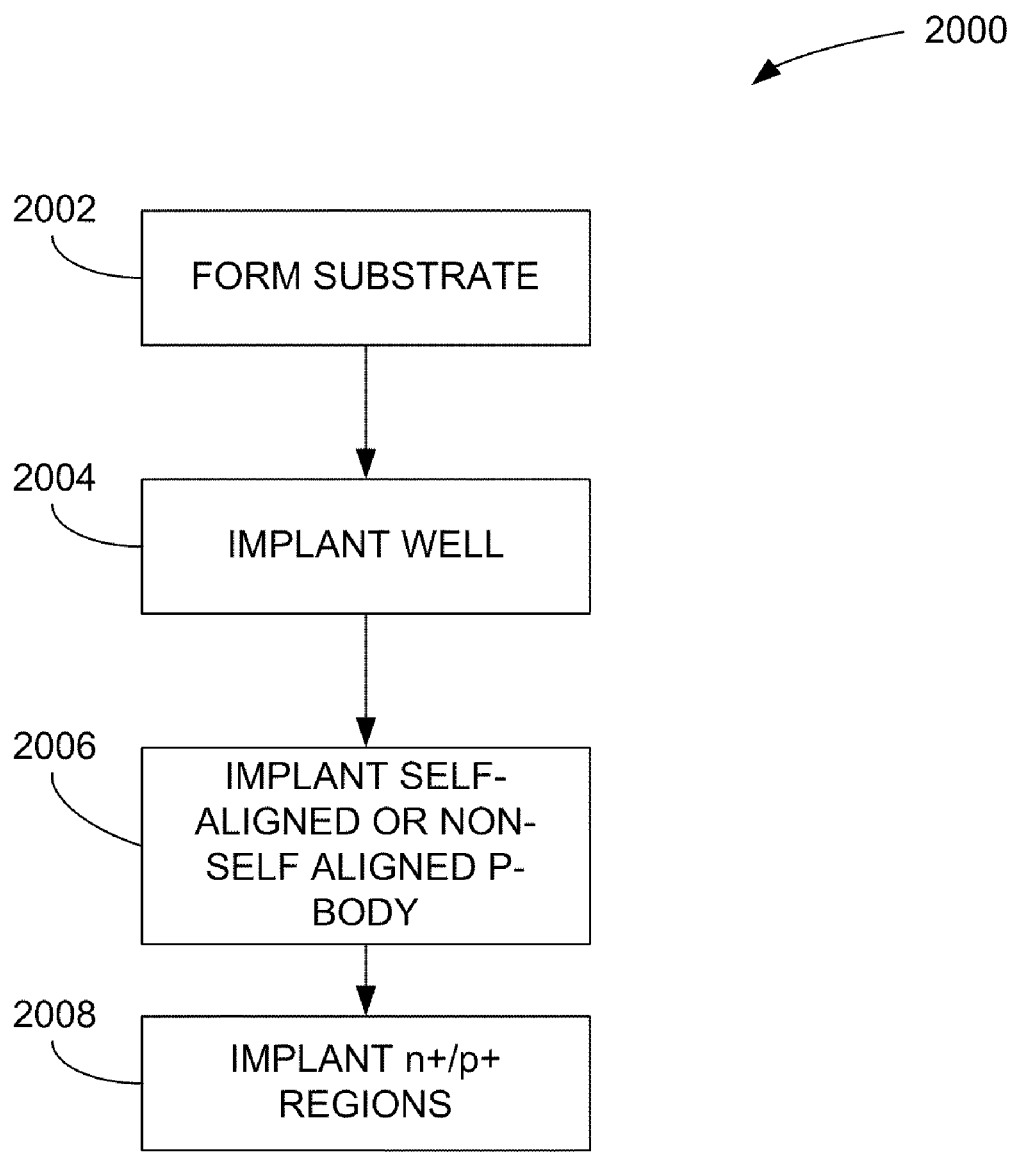
FIG. 20 is a flow diagram illustrating an exemplary process for manufacturing the NPN transistor of FIG. 19.

FIG. 20 illustrates a process 2000 for fabricating an PNP transistor, such as PNP transistor 2000. The process 2000 begins with forming a substrate (step 2002), such as p-type substrate 1902 (FIG. 19). A well for the NPN transistor is implanted into the substrate (step 2004). The implanted well can be an HV (high voltage) n-well 1904, as shown in the example of FIG. 19. A non-self aligned P-body is implanted into the surface of the transistor (step 2006), which is illustrated as P-body 1906 in FIG. 19. The gate oxide and gate polysilicon are formed. The n+ regions and p+ regions of the PNP transistor are implanted (step 2008), such as n+ regions 1908 and 1910, and p+ region 1912 (FIG. 19). Alternatively, the P-body 1906 can be self-aligned, and implanted after formation of the gate oxide and gate polysilicon.

The availability of complementary NPN and PNP transistors enhances high performance analog circuit design.

CMOS Transistors with Floating Operation Capability

Figure 21A:
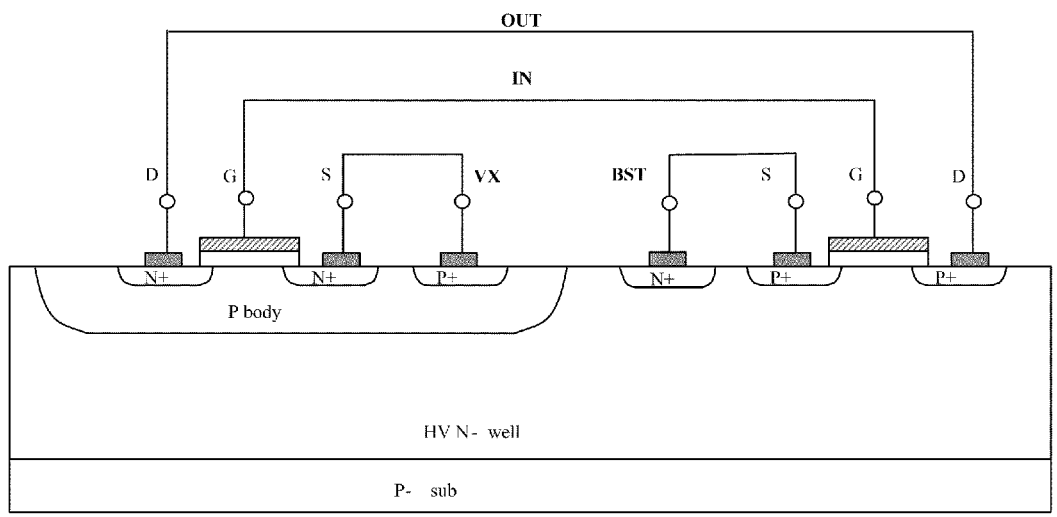
FIG. 21A is a schematic cross-sectional view of an implementation of high-side drive (HSD) circuits with CMOS logic.
Figure 21B:
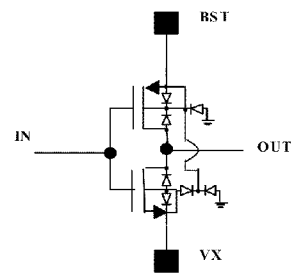
FIG. 21B is a circuit diagram of HSD circuits with CMOS logic.

An NMOS transistor with floating operation capability (i.e., the source of the NMOS transistor is not grounded) can be implemented through processes 600, 1000, as described above. Such an NMOS transistor, together with a PMOS transistor fabricated in an HV n-well, allows for the implementation of high-side drive (HSD) circuits (e.g., LDMOS driver 1808) with CMOS transistor logic as shown in FIGS. 21A and 21B.

Figure 22:
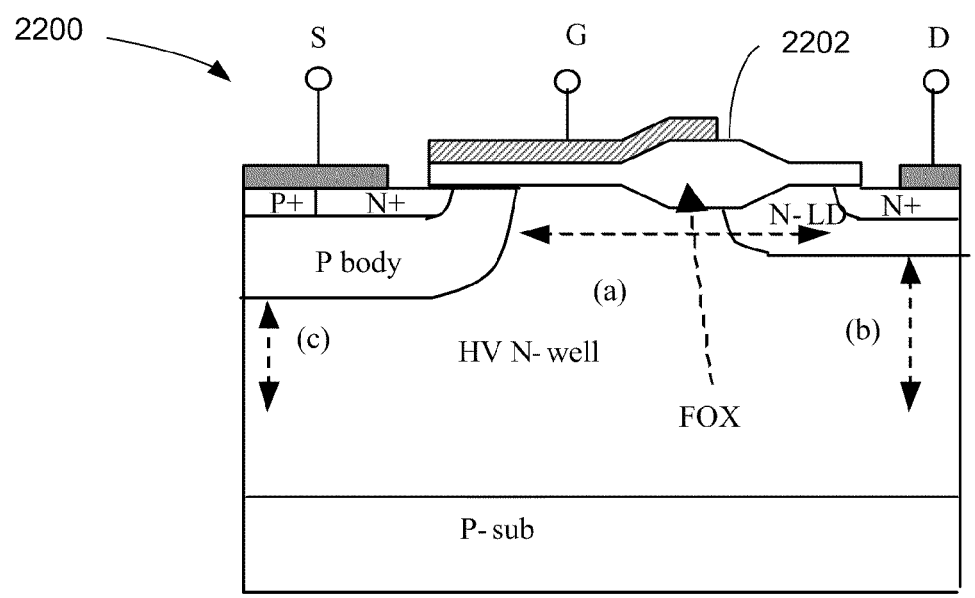
FIG. 22 is a schematic cross-sectional view of a LDMOS transistor with LOCOS on the drain region of the transistor.

A number of embodiments of the invention have been described. Nevertheless, it will be understood that various modifications may be made without departing from the spirit and scope of the invention. For example, although some of the LDMOS transistor structures described above do not have LOCOS field oxide (FOX) 2202 on the drain region of the devices. The processes described above also apply to LDMOS transistor structures with LOCOS on the drain region of the devices such as LDMOS transistor 2200 shown in FIG. 22. The devices described above can be implemented in general half-bridge or full-bridge circuits, and also in other power electronics systems.

Figure 23:
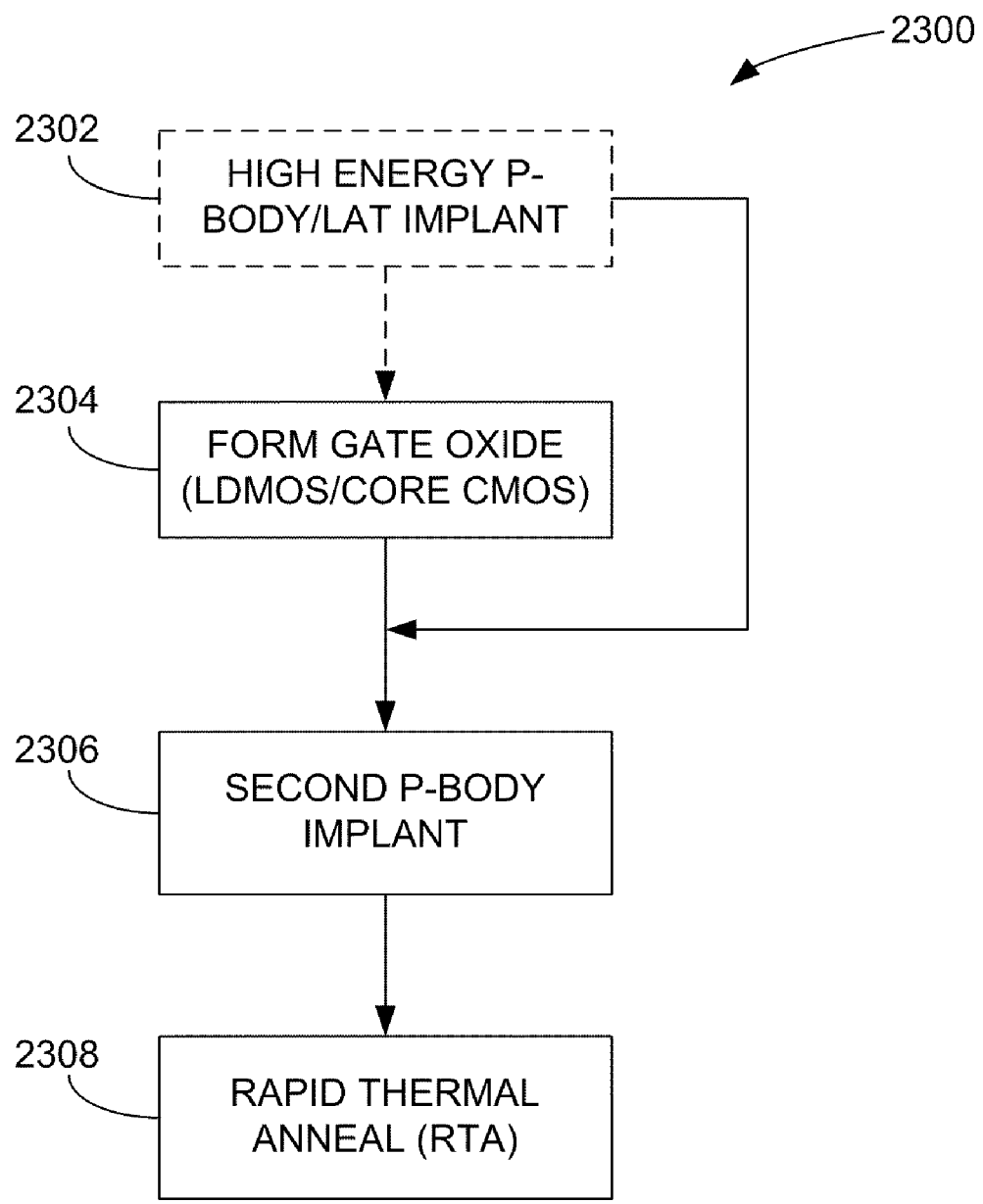
FIG. 23 is a flow diagram illustrating an exemplary process for implanting a P-body of an LDMOS transistor.

A common feature of the LDMOS transistors described above is that the P-body implant is formed prior to gate oxide formation of conventional CMOS transistors to ensure that the LDMOS transistors can be fabricated in a process that is compatible with a sub-micron CMOS process. As discussed above, in one implementation, the P-body can implanted in two steps using a first high energy implant and a second implant, followed by a RTA process. The first high energy implant can be implanted using a LAT implant. FIG. 23 shows a process 2300 for implanting the P-body without substantially disturbing the CMOS process thermal cycle. The second implant (step 2306), or both the high energy implant (step 2302) and second implant, can occur after gate formation of CMOS transistors (step 2304). The second implant is followed by a RTA process (step 2308). The RTA process is implemented with a short duration of time and at temperatures such that thermal cycles allocated to fabricating sub-micron CMOS transistors are substantially unaffected. As discussed above, an LDMOS transistor can be fabricated on an n-type substrate. In such an implementation, an SOI (silicon-on-insulator) insulation layer can be deposited (or grown) on the n-type substrate. A p-well for the LDMOS transistor and CMOS transistors can then be implanted. The process steps following formation of the substrate in processes 600, 1000 can then occur.

Accordingly, other implementations are within the scope of the following claims.

What is claimed is:

1. A method of fabricating a semiconductor device, the method comprising:
    forming an LDMOS transistor on a substrate, the LDMOS transistor including a first drain with a first drain-side n+ region, a first source with a first source-side n+ region and a first source-side p+ region, and a first gate between the first drain and the first source; and
    forming an n-type CMOS transistor on the substrate, the n-type CMOS transistor including a second drain having a second drain-side n+ region, a second source having a second source-side n+ region, and a second gate between the second drain and the second source;
    wherein forming the LDMOS transistor and forming the n-type CMOS transistor comprise a first implant step that, without implanting into the first drain, simultaneously implants a first lightly n-doped region in the first source to overlap the first source-side n+ region and to extend beneath the first gate, and a second lightly n-doped region in the second drain to overlap the second drain-side n+ region and to extend beneath the second gate.

2. The method of claim 1, wherein forming the LDMOS transistor and forming the n-type CMOS transistor comprise a second implant step that simultaneously implants the first drain-side n+ region, the first source-side n+ region, the second drain-side n+ region and the second source-side n+ region.

3. The method of claim 1, further comprising forming a p-type CMOS transistor on the substrate, the p-type CMOS transistor including a third drain having a first drain-side p+ region, a third source having a second source-side p+ region, and a third gate between the third drain and the third source.

4. The method of claim 3, wherein forming the LDMOS transistor and forming the p-type CMOS transistor comprise a second implant step that simultaneously implants the first source-side p+ region, the first drain-side p+ region and the second source-side p+ region.

5. The method of claim 3, further comprising:
    forming a PMOS transistor on the substrate, the PMOS transistor including a fourth drain having a second drain-side p+ region, a fourth source having a third source-side p+ region, and a fourth gate between the fourth drain and the fourth source; and
    forming a NMOS transistor on the substrate, the NMOS transistor including a fifth drain having a third drain-side n+ region, a fifth source having a third source-side n+ region, and a fifth gate between the fifth drain and the fifth source.

6. The method of claim 5, wherein forming the NMOS transistor includes forming the third drain-side n+ region and the third source-side n+ region at the same time as the first drain-side n+ region and the first source-side n+ region of the LDMOS transistor and the second drain-side n+ region and the second source-side n+ region of the n-type CMOS transistor.

7. The method of claim 5, wherein forming the PMOS transistor includes forming the second drain-side p+ region and the third source-side p+ region at the same time as the first source-side p+ region of the LDMOS transistor and the first drain-side p+ region and the second source-side p+ region of the p-type CMOS transistor.

8. The method of claim 2, further comprising forming a gate oxide for each of the LDMOS transistor and the n-type CMOS transistor simultaneously to provide a uniform gate oxide thickness between the LDMOS transistor and the n-type CMOS transistor.

9. The method of claim 8, further comprising forming oxide spacers, wherein the first implant step is performed prior to forming the oxide spacers and the second implant step is performed after forming the oxide spacers.

10. The method of claim 1, further comprising forming a gate oxide for each of the LDMOS transistor and the n-type CMOS transistor at different times and such that the LDMOS transistor is formed with a gate oxide thickness different from that of the n-type CMOS transistor.

* * * * *

UNITED STATES PATENT AND TRADEMARK OFFICE
CERTIFICATE OF CORRECTION

PATENT NO. : 8,071,436 B2
APPLICATION NO. : 12/714914
DATED : December 6, 2011
INVENTOR(S) : Budong You and Marco A. Zuniga Page 1 of 1

It is certified that error appears in the above-identified patent and that said Letters Patent is hereby corrected as shown below:

ON THE TITLE PAGE:

Item (54) (Title), delete "CMOS" and insert -- A CMOS -- therefor.

Item (57) (Abstract), after "second drain", delete "having a second drain".

IN THE SPECIFICATIONS:

On Col. 1, line 5, delete "CMOS" and insert -- A CMOS -- therefor.

Signed and Sealed this
Twenty-first Day of February, 2012

David J. Kappos
*Director of the United States Patent and Trademark Office*